United States Patent
Goodall et al.

(12) 
(10) Patent No.: US 6,790,579 B1
(45) Date of Patent: Sep. 14, 2004

(54) PHOTORESIST COMPOSITIONS COMPRISING POLYCYCLIC POLYMERS WITH ACID LABILE PENDANT GROUPS

(75) Inventors: Brian L. Goodall, Akron, OH (US); Saikumar Jayaraman, Cuyahoga Falls, OH (US); Robert A. Shick, Strongsville, OH (US); Larry F. Rhodes, Silverlake, OH (US)

(73) Assignee: Sumitomo Bakelite Co., Ltd., Tokyo (JP)

( * ) Notice: Subject to any disclaimer, the term of this patent is extended or adjusted under 35 U.S.C. 154(b) by 773 days.

(21) Appl. No.: 09/630,894

(22) Filed: Aug. 2, 2000

Related U.S. Application Data

(63) Continuation of application No. 08/812,418, filed on Mar. 6, 1997, now Pat. No. 6,136,499.
(60) Provisional application No. 60/025,174, filed on Mar. 7, 1996.

(51) Int. Cl.$^7$ ........................... G03F 7/039; G03F 7/023
(52) U.S. Cl. .................. 430/170; 430/192; 430/270.1; 430/905
(58) Field of Search ............................ 430/270.1, 170, 430/905, 189, 192

(56) References Cited

U.S. PATENT DOCUMENTS

| | | | | | |
|---|---|---|---|---|---|
| 5,397,680 A | * | 3/1995 | Schadeli et al. | ......... | 430/270.1 |
| 5,399,647 A | * | 3/1995 | Nozaki | ....................... | 526/297 |
| 5,585,222 A | * | 12/1996 | Kaimoto et al. | ............ | 430/296 |
| 5,660,969 A | * | 8/1997 | Kaimoto | .................. | 430/270.1 |
| 5,665,518 A | * | 9/1997 | Maeda et al. | ............ | 430/270.1 |
| 5,691,111 A | * | 11/1997 | Iwasa et al. | ............. | 430/270.1 |

FOREIGN PATENT DOCUMENTS

| | | | | |
|---|---|---|---|---|
| EP | 0 789 278 | 8/1997 | | |
| EP | 0 836 119 | 8/1998 | | |
| JP | 05297591 A | * 11/1993 | .......... | G03F/7/039 |
| WO | 97/33198 | 9/1997 | | |

\* cited by examiner

Primary Examiner—John S. Chu
(74) Attorney, Agent, or Firm—Hudak, Shunk & Farine Co.

(57) ABSTRACT

The present invention relates to a radiation sensitive photoresist composition comprising a photoacid initiator and a polycyclic polymer comprising repeating units that contain pendant acid labile groups. Upon exposure to an imaging radiation source the photoacid initiator generates an acid which cleaves the pendant acid labile groups effecting a polarity change in the polymer. The polymer is rendered soluble in an aqueous base in the areas exposed to the imaging source.

28 Claims, No Drawings

PHOTORESIST COMPOSITIONS COMPRISING POLYCYCLIC POLYMERS WITH ACID LABILE PENDANT GROUPS

This application is a continuation of application Ser. No. 08/812,418 filed on Mar. 6, 1997, U.S. Pat. No. 6,136,499, which claims benefit of Ser. No. 60/025,174 Mar. 7, 1996.

BACKGROUND OF THE INVENTION

1. Technical Field

The present invention is related to polycyclic polymers and methods for their use as photoresists in the manufacture of integrated circuits. More specifically, the invention is directed to photoresist compositions comprising a polycyclic polymer and a cationic photoinitiator. The polycyclic polymer contains recurring acid labile groups that are pendant from the polymer backbone. The acid labile groups can be selectively cleaved to form recurring polar groups along the backbone of the polymer. The polymers are transparent to short wave lengths of imaging radiation and exhibit resistance to reactive ion etching.

2. Background

Integrated circuits (IC's) are paramount in the manufacture of an array of electronic devices. They are fabricated from the sequential formation of alternating and interconnecting bands of conductive, semiconductive and nonconductive layers on an appropriate substrate (e.g., silicon wafer) that are selectively patterned to form circuits and interconnections to produce specific electrical functions. The patterning of IC's is carried out according to various lithography techniques known in the art. Photolithography employing ultraviolet (UV) light and increasingly deep UV light or other radiation is a fundamental and important technology utilized in the production of IC devices. A photosensitive polymer film (photoresist) is applied over the wafer surface and dried. A photomask containing the desired patterning information is then placed in close proximity to the photoresist film. The photoresist is irradiated through the overlying photomask by one of several types of imaging radiation including UV light, e⁻ beam electrons, x-rays, or ion beam. Upon exposure to radiation, the photoresist undergoes a chemical change with concomitant changes in solubility. After irradiation, the wafer is soaked in a solution that develops (i.e., selectively removes either the exposed or unexposed regions) the patterned images in the photosensitive polymer film. Depending on the type of polymer used, or the polarity of the developing solvent, either the exposed or nonexposed areas of film are removed in the developing process to expose the underlying substrate, after which the patterned exposed or unwanted substrate material is removed or changed by an etching process leaving the desired pattern in a functional layer of the wafer. Etching is accomplished by plasma etching, sputter etching, and reactive ion etching (RIE). The remaining photoresist material functions as a protective barrier against the etching process. Removal of the remaining photoresist material gives the patterned circuit.

In the manufacture of patterned IC devices, the processes of etching different layers on the wafer are among the most crucial steps involved. One method is to immerse the substrate and patterned resist in a chemical bath which attacks the exposed substrate surfaces while leaving the resist itself intact. This "wet" chemical process suffers from the difficulty of achieving well defined edges on the etched surfaces. This is due to chemical undercutting of the resist material and the formation of an isotropic image. In other words, conventional chemical processes do not provide the selectivity of direction (anisotropy) considered necessary to achieve optimum dimensional specifications consistent with current processing requirements. In addition, the wet processes suffer because of the undesirable environmental and safety ramifications.

Various "dry" processes have been developed to overcome the drawbacks of the wet chemical process. Such dry processes generally involve passing a gas through a chamber and ionizing the gas by applying a potential across two electrodes in the presence of the gas. The plasma containing the ionic species generated by the potential is used to etch a substrate placed in the chamber. The ionic species generated in the plasma are directed to the exposed substrate where they interact with the surface material forming volatile products that are removed from the surface. Typical examples of dry etching are plasma etching, sputter etching and reactive ion etching.

Reactive ion etching provides well defined vertical sidewall profiles in the substrate as well as substrate to substrate etching uniformity. Because of these advantages, the reactive ion etching technique has become the standard in IC manufacture.

Two types of photoresists are used in the industry, negative and positive photoresists. Negative resists, upon exposure to imaging radiation, polymerize, crosslink, or change solubility characteristics such that the exposed regions are insoluble to the developer. Unexposed areas remain soluble and are washed away. Positive resists function in the opposite way, becoming soluble in the developer solution after exposure to imaging radiation.

One type of positive photoresist material is based upon phenol-formaldehyde novolac polymers. A particular example is the commercially utilized Shipley AZ1350 material which comprises an m-cresol formaldehyde novolak polymer composition and a diazoketone (2-diazo-1-napthol-5-sulphonic acid ester). When exposed to imaging radiation, the diazoketone is converted to a carboxylic acid, which in turn converts the phenolic polymer to one that is readily soluble in weak aqueous base developing agent.

U.S. Pat. No. 4,491,628 to Ito et al. discloses positive and negative photoresist compositions with acid generating photoinitiators and polymers with acid labile pendant groups. Because each acid generated causes deprotection of multiple acid labile groups this approach is known as chemical amplification which serves to increase the quantum yield of the overall photochemical process. The disclosed polymers include vinylic polymers such as polystyrenes, polyvinylbenzoates, and polyacrylates that are substituted with recurrent pendant groups that undergo acidolysis to produce products that differ in solubility than their precursors. The preferred acid labile pendant groups include t-butyl esters of carboxylic acids and t-butyl carbonates of phenols. The photoresist can be made positive or negative depending on the nature of the developing solution employed.

Trends in the electronics industry continually require IC's that are faster and consume less power. To meet this specification the IC must be made smaller. Conducting pathways (i.e., lines) must be made thinner and placed closer together. The significant reduction in the size of the transistors and the lines produced yields a concomitant increase in the efficiency of the IC, e.g., greater storage and processing of information on a computer chip. To achieve thinner line widths, higher photoimaging resolution is necessary. Higher resolutions are possible with shorter wave lengths of the exposure source employed to irradiate the photoresist material. However, the prior art photoresists such as the phenol-formaldehyde novolac polymers and the substituted styrenic polymers contain aromatic groups that inherently become increasingly absorptive as the wave length of light falls below about 300 nm, (ACS Symposium Series 537, *Polymers for Microelectronics, Resists and Dielectrics*, 203rd National Meeting of the American Chemical Society, April 5–10, 1992, p.2–24; *Polymersfor Electronic and Photonic Applications*, Edited by C. P. Wong, Academic Press, p. 67–118). Shorter wave length sources are typically less bright than traditional sources which necessitate a chemical amplification approach using photoacids. The opacity of these aromatic polymers to short wave length light is a drawback in that the photoacids below the polymer surface are not uniformly exposed to the light source and, consequently, the polymer is not developable. To overcome the transparency deficiencies of these polymers, the aromatic content of photoresist polymers must be reduced. If deep UV transparency is desired (i.e., for 248 nm and particularly 193 nm wave length exposure), the polymer should contain a minimum of aromatic character.

U.S. Pat. No. 5,372,912 concerns a photoresist composition containing an acrylate based copolymer, a phenolic type binder, and a photosensitive acid generator. The acrylate based copolymer is polymerized from acrylic acid, alkyl acrylate or methacrylate, and a monomer having an acid labile pendant group. While this composition is sufficiently transparent to UV radiation at a wave length of about 240 nm, the use of aromatic type binders limits the use of shorter wave length radiation sources. As is common in the polymer art, the enhancement of one property is usually accomplished at the expense of another. When employing acrylate based polymers, the gain in transparency to shorter wave length UV is achieved at the expense of sacrificing the resist's resistance to the reactive ion etch process.

In many instances, the improvement in transparency to short wave length imaging radiation results in the erosion of the resist material during the subsequent dry etching process. Because photoresist materials are generally organic in nature and substrates utilized in the manufacture of IC's are typically inorganic, the photoresist material has an inherently higher etch rate than the substrate material when employing the RIE technique. This necessitates the need for the photoresist material to be much thicker than the underlying substrate. Otherwise, the photoresist material will erode away before the underlying substrate could be fully etched. It follows that lower etch rate resist materials can be employed in thinner layers over the substrate to be etched. Thinner layers of resist material allow for higher resolution which, ultimately, allows for narrower conductive lines and smaller transistors.

J. V. Crivello et al. (Chemically Amplified Electron-Beam Photoresists, *Chem. Mater.*, 1996, 8, 376–381) describe a polymer blend comprising 20 weight % of a free radically polymerized homopolymer of a norbornene monomer bearing acid labile groups and 80 weight % of a homopolymer of 4-hydroxy-α-methylstyrene containing acid labile groups for use in electron-beam photoresists. As discussed supra, the increased absorbity (especially in high concentrations) of aromatic groups renders these compositions opaque and unusable for short wave length imaging radiation below 200 nm.

The disclosed compositions are suitable only for electron-beam photoresists and can not be utilized for deep UV imaging (particularly not for 193 nm resists).

Crivello et al. investigated blend compositions because they observed the oxygen plasma etch rate to be unacceptably high for free radically polymerized homopolymers of norbornene monomers bearing acid labile groups.

Accordingly, there is a need for a photoresist composition which is compatible with the general chemical amplification scheme and provides transparency to short wave length imaging radiation while being sufficiently resistant to a reactive ion etching processing environment.

SUMMARY OF THE INVENTION

It is a general object of the invention to provide a photoresist composition comprising a polycyclic polymer backbone having pendant acid labile groups and a photo-initiator.

It is another object of the invention to provide polycyclic polymers that have recurrent pendant acid labile groups that can be cleaved to form polar groups.

It is still another object of the invention to provide polymer compositions that are transparent to short wave length imaging radiation.

It is a further object of the invention to provide polymer compositions that are resistant to dry etching processes.

It is a still further object of the invention to provide polymer compositions that are transparent to short wave length imaging radiation and are resistant to dry etching processes.

It is yet another object of the invention to provide polycyclic monomers that contain acid labile pendant groups that can be polymerized to form polymers amenable to aqueous base development.

These and other objects of the invention are accomplished by polymerizing a reaction mixture comprising an acid labile group functionalized polycycloolefinic monomer, a solvent, a single or multicomponent catalyst system each containing a Group VIII metal ion source. In the multicomponent catalyst systems of the invention the Group VIII ion source is utilized in combination with one or both of an organometal cocatalyst and a third component. The single and multicomponent catalyst systems can be utilized with an optional chain transfer agent (CTA) selected from a compound having a terminal olefinic double bond between adjacent carbon atoms, wherein at least one of said adjacent carbon atoms has two hydrogen atoms attached thereto. The CTA is selected from unsaturated compounds that are typically cationically non-polymerizable and, therefore, exclude styrenes, vinyl ethers, and conjugated dienes.

The polymers obtained are useful in photoresist compositions that include a radiation-sensitive acid generator.

DETAILED DESCRIPTION

The present invention relates to a radiation-sensitive resist composition comprising an acid-generating initiator and a polycyclic polymer containing recurring acid labile pendant groups along the polymer backbone. The polymer containing the initiator is coated as a thin film on a substrate, baked under controlled conditions, exposed to radiation in a patterned configuration, and optionally post baked under controlled conditions to further promote the deprotection. In the portions of the film that have been exposed to radiation, the recurrent acid labile pendant groups on the polymer backbone are cleaved to form polar recurring groups. The exposed areas so treated are selectively removed with an alkaline developer. Alternatively, the unexposed regions of the polymer remain nonpolar and can be selectively removed by treatment with a suitable nonpolar solvent for a negative tone development. Image reversal can easily be achieved by proper choice of developer owing to the difference in the solubility characteristics of the exposed and unexposed portions of the polymer.

The polymers of the present invention comprise polycyclic repeating units, a portion of which are substituted with acid labile groups. The instant polymers are prepared by polymerizing the polycyclic monomers of this invention. By the term "polycyclic" (norbornene-type or norbornene-functional) is meant that the monomer contains at least one norbornene moiety as shown below:

The simplest polycyclic monomer of the invention is the bicyclic monomer, bicyclo[2.2.1]hept-2-ene, commonly referred to as norbornene. The acid labile functionality is introduced into the polymer chain by polymerizing a reaction medium comprising one or more acid labile substituted polycyclic monomers set forth under Formula I below in optional combination with one or more polycyclic monomers set forth under Formulae II, III, IV, and V below in the presence of the Group VIII metal catalyst system.

Monomers

The acid labile polycyclic monomers useful in the practice of the present invention are selected from a monomer represented by the formula below:

I

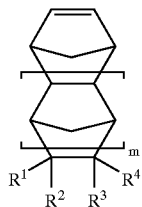

wherein $R^1$ to $R^4$ independently represent a substituent selected from the group —$(CH_2)_nC(O)OR^*$, —$(CH_2)_n$—C(O)OR, —$(CH_2)_n$—OR, —$(CH_2)_n$—OC(O)R, —$(CH_2)_n$—C(O)R and —$(CH_2)_n$—OC(O)OR, —$(CH_2)_nC(R)_2CH(R)(C(O)OR^{})$, and —$(CH_2)_nC(R)_2CH(C(O)OR^{})_2$ subject to the proviso that at least one of $R^1$ to $R^4$ is selected from the acid labile group —$(CH_2)_nC(O)OR^*$, R represents hydrogen, linear and branched ($C_1$ to $C_{10}$) alkyl, and m is an integer from 0 to 5, and n is an integer from 0 to 10, preferably n is 0. $R^*$ represents moieties (i.e., blocking or protecting groups) that are cleavable by photoacid initiators selected from —$C(CH_3)_3$, —$Si(CH_3)_3$, isobornyl, 2-methyl-2-adamantyl, tetrahydrofuranyl, tetrahrydropyranoyl, 3-oxocyclohexanonyl, mevalonic lactonyl, dicyclopropylmethyl (Dcpm), and dimethylcyclopropylmethyl (Dmcp) groups. $R^{**}$ independently represents R and $R^*$ as defined above. The Dcpm and Dmcp groups are respectively represented by the following structures:

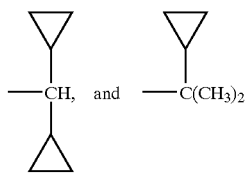

Polycyclic monomers of the above formula with a substituent selected from the group —$(CH_2)_nC(R)_2CH(R)(C(O)OR^{})$ or —$(CH_2)_nC(R)_2CH(C(O)OR^{})_2$ can be represented as follows:

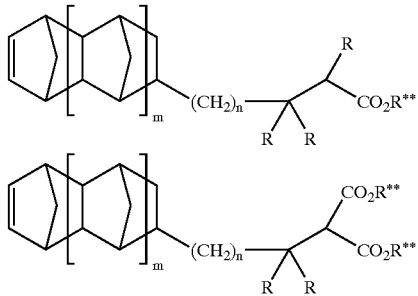

In the above formulae m is preferably 0 or 1, more preferably m is 0. When m is 0 the preferred structures are represented below:

Ia

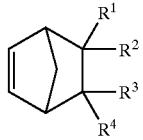

wherein $R^1$ to $R^4$ are previously defined.

It should be apparent to those skilled in the art that any photoacid cleavable moiety is suitable in the practice of the invention so long as the polymerization reaction is not substantially inhibited by same.

The preferred acid labile groups are the organic ester groups which undergo a cleavage reaction in the presence of an acid. Preferred acid labile groups include ester groups and carbonate groups. The t-butyl esters of carboxylic acids are especially preferred.

The monomers described under Formula I, when polymerized into the polymer backbone, provide recurring pendant acid sensitive groups that are subsequently cleaved to confer polarity or solubility to the polymer.

The optional second monomer is represented by the structure set forth under Formula II below:

II

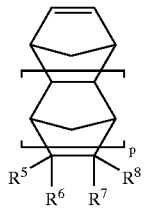

wherein $R^5$ to $R^8$ independently represent a neutral substituent selected from the group: —$(CH_2)_n$—C(O)OR", —(CH$_2$)$_n$—OR", —(CH$_2$)$_n$—OC(O)R", —(CH$_2$)$_n$—OC(O) OR", —(CH$_2$)$_n$—C(O)R", —(CH$_2$)$_n$C(R*)$_2$CH(R*)(C(O) OR*), and —(CH$_2$)$_n$C(R*)$_2$CH(C(O)OR*)$_2$ wherein p is an integer from 0 to 5 (preferably 0 or 1, more preferably 0) and n is an integer from 0 to 10 (preferably 0). R$^5$ to R$^8$ can independently represent hydrogen, linear and branched (C$_1$ to C$_{10}$) alkyl, so long as at least one of the remaining R$^5$ to R$^8$ substituents is selected from one of the neutral groups represented above. R independently represents hydrogen and linear and branched (C$_1$ to C$_{10}$) alkyl, R" represents hydrogen, linear and branched (C$_1$ to C$_{10}$) alkyl, monocyclic and polycyclic (C$_4$ to C$_{20}$) cycloaliphatic moieties, cyclic ethers, cyclic keytones, and cyclic esters (lactones). Examples of cycloaliphatic monocyclic moieties include cyclopropyl, cyclobutyl, cyclopentyl, cyclohexyl, and the like. Examples of cycloaliphatic polycyclic moieties include, norbornyl, adamantyl, tetrahrydrbdicyclopentadienyl (tricyclo[5.2.1.0$^{2,6}$] decanyl), and the like. Examples of cyclic ethers include tetrahydrofuranyl and tetrahrydropyranyl moieties. An example of a cyclic ketone is a 3-oxocyclohexanonyl moiety. An example of a cyclic ester or lactone is a mevalonic lactonyl moiety.

The preferred monomers under Formula II are the (C$_1$ to C$_5$) alkyl esters of the carboxylic acid with the methyl and ethyl esters particularly preferred. The ester functionalities impart hydrophilicity, promote good wetting of the developer and improve film mechanical properties.

The optional third monomer component is represented by the structure under Formula III below:

III

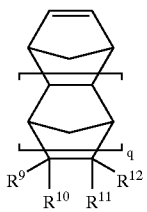

wherein R$^9$ to R$^{12}$ independently represent a carboxylic substituent selected from the formula —(CH$_2$)$_n$C(O)OH, wherein q is an integer from 0 to 5 (preferably 0 or 1, more preferably 0) and n is an integer from 0 to 10 (preferably 0). R$^9$ to R$^{12}$ can independently represent hydrogen, linear and branched (C$_1$ to C$_{10}$) alkyl, so long as at least one of the remaining R$^9$ to R$^{12}$ substituents is selected from a carboxylic acid group represented above.

The monomers containing carboxylic acid functionality contribute to the hydrophilicity of the polymer consequently aiding in the developability of the polymer in aqueous base systems at high rates.

The optional monomers under Formula IV are represented by the structure below:

IV

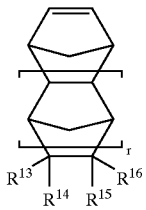

wherein R$^{13}$ to R$^{16}$ independently represent linear or branched (C$_1$ to C$_{10}$) alkyl and r is an integer from 0 to 5 (preferably 0 or 1, more preferably 0). Any of R$^{13}$ to R$^{16}$ can represent hydrogen so long as at least one of the remaining R$^{13}$ to R$^{16}$ substituents is selected from an alkyl group set defined above. Of the above alkyl substituents, decyl is especially preferred.

The polymerization of alkyl substituted monomers into the polymer backbone is a method to control the Tg of the polymer as disclosed in U.S. Pat. No. 5,468,819 to Goodall et al.

An economical route for the preparation of the functional or hydrocarbyl substituted polycyclic monomers of the invention relies on the Diels-Alder reaction in which cyclopentadiene (CPD) or substituted CPD is reacted with a suitably substituted dienophile at elevated temperatures to form a substituted polycyclic adduct generally shown by the following reaction scheme:

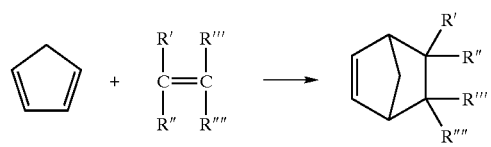

Other polycyclic adducts can be prepared by the thermal pyrolysis of dicyclopentadiene (DCPD) in the presence of a suitable dienophile. The reaction proceeds by the initial pyrolysis of DCPD to CPD followed by the Diels-Alder addition of CPD and the dienophile to give the adducts as shown below:

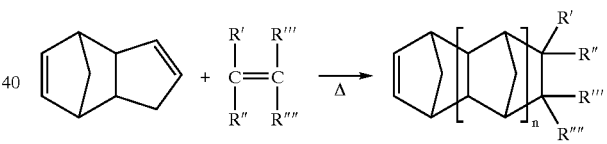

wherein R' to R"" independently represents the substituents defined under R$^1$ to R$^{16}$ in Formulae I, II, III, and IV above.

For example the 2-norbornene-5-carboxylic acid (bicyclo [2.2.1]hept-5-ene-2-carboxylylic acid) can be prepared by the Diels-Alder reaction of cyclopentadiene with acrylic acid in accordance with the following reaction scheme:

The corresponding t-butyl ester of the carboxylic acid can be prepared by reacting the carboxylic acid functionality with isobutylene in the presence of triflic acid at reduced temperatures (i.e., −30 to −20° C.) as shown in the reaction scheme below:

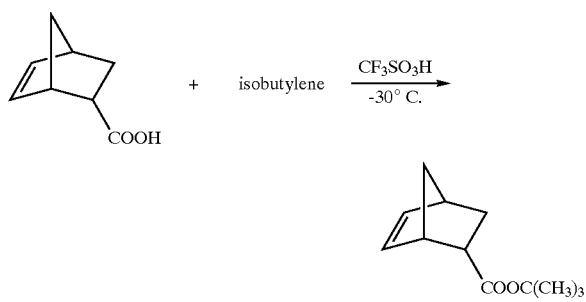

Another more preferred route to the t-butyl ester of the norbornene carboxylic acid involves the Diels-Alder reaction of cyclopentadiene with t-butyl acrylate.

Another synthesis route to the acid and ester substituted monomers of the present invention is through an ortho ester substituted polycyclic monomer with subsequent hydrolysis to a carboxylic functionality or partial hydrolysis to an ester functionality. The carboxylic functionality can be esterified to the desired ester The ortho ester substituted monomers of the invention are represented by Formula V below:

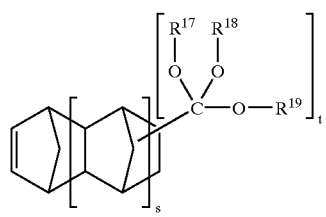

wherein $R^{17}$, $R^{18}$, and $R^{19}$ independently represent a linear or branched ($C_1$ to $C_5$) alkyl group or any $R^{17}$, $R^{18}$, and $R^{19}$ can be taken together along with the oxygen atoms to which they are attached to form a substituted or unsubstituted 5 to 10 membered cyclic or bicyclic ring containing 3 to 8 carbon atoms (excluding substituent groups), s is an integer from 0 to 5 (preferably 0), and t is an integer from 1 to 5 (preferably 1). Representative structures wherein s is 0, t is 1, and $R^{17}$, $R^{18}$, and $R^{19}$ are taken with the oxygen atoms to which they are attached to form a cyclic or bicyclic ring are set forth below:

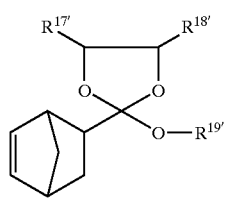

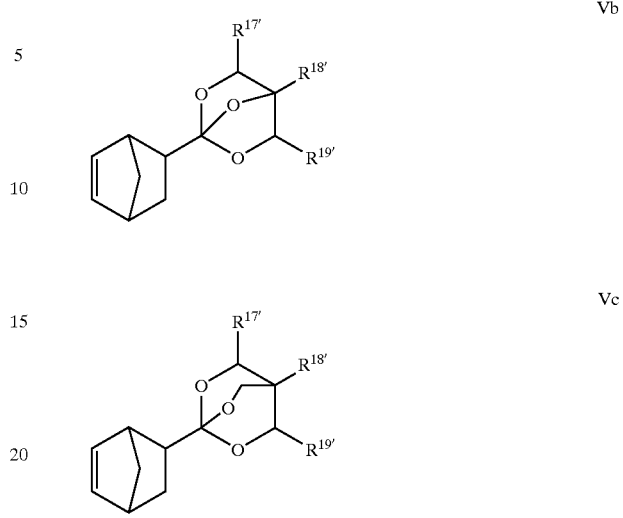

wherein $R^{17'}$, $R^{18'}$, and $R^{19'}$ independently represent hydrogen and linear and branched ($C_1$ to $C_5$) alkyl. The ortho esters of the present invention can be synthesized in accordance with the so-called Pinner synthesis (A. Pinner, *Chem. Ber.*, 16, 1643 (1883), and via the procedure set forth by S. M. McElvain and J. T. Venerable, *J. Am. Chem. Soc.*, 72, 1661 (1950); S M. McElvain and C. L. Aldridge, *J. Am. Chem. Soc.*, 75, 3987 (1953). A typical synthesis is set forth in the reaction scheme below:

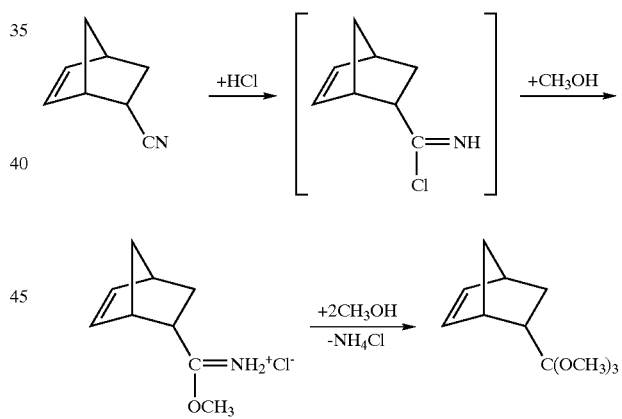

An alternative synthesis route wherein an alkyl acrylate is treated with a trialkyloxonium tetrafluoroborate salt followed by an alkali metal (sodium alcoholate) to yield the trialkoxymethyl ortho ester (H. Meerwein, P. Borner, O. Fuchs, H. J. Sasse, H. Schrodt, and J. Spille, *Chem. Ber.*, 89, 2060 (1956).

As discussed above the otho ester can undergo a hydrolysis reaction in the presence of dilute acid catalysts such as hydrobromic, hydroiodic, and acetic acid to yield the carboxylic acid. The carboxylic acid can in turn be esterified in the presence of an aliphatic alcohol and an acid catalyst to yield the respective ester. It should be recognized that in the case of polycyclic monomers that are di- or multi-substituted with ortho ester groups that the ortho ester moieties can be partially hydrolyzed to yield the acid and a conventional ester on the same monomer as illustrated below:

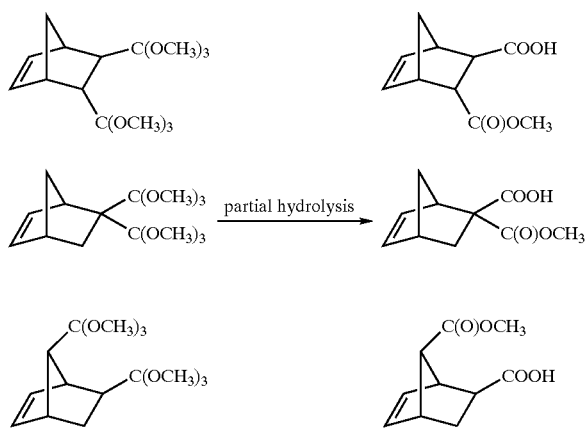

Another and more preferred route to difunctional polycyclic monomers is through the hydrolysis and partial hydrolysis of nadic anhydride (endo-5-norbornene-2,3-dicarboxylic anhydride). Nadic anhydride can be fully hydrolyzed to the dicarboxylic acid or partially hydrolyzed to the an acid and ester functionality or diester functionality as shown below:

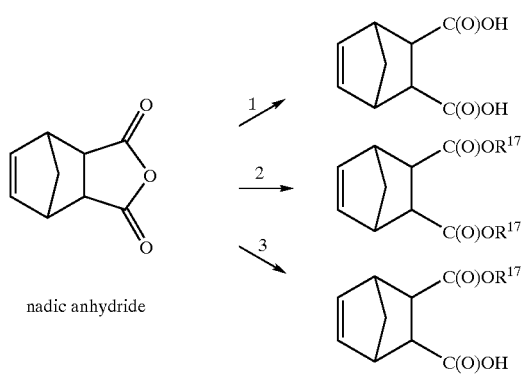

wherein $R^{17}$ independently represents linear and branched ($C_1$ to $C_5$) alkyl. Preferably $R^{17}$ is methyl, ethyls or t-butyl. In a preferred synthesis the nadic anhydride starting material is the exo-isomer. The exo-isomer is easily prepared by heating the endo-isomer at 190° C. followed by recrystallization from an appropriate solvent (toluene). To obtain the diacid under reaction scheme 1, nadic anhydride is simply hydrolyzed in boiling water to obtain almost a quantitative yield of the diacid product. The mixed carboxylic acid—alkyl ester functionality shown in scheme 3 is obtained by heating nadic anhydride under reflux for 3 to 4 hours in the presence of the appropriate aliphatic alcohol ($R^{17}OH$). Alternatively, the same product can be prepared by first reacting the nadic anhydride starting material with an aliphatic alcohol and trialkyl amine followed by treatment with dilute HCl. The diester product substituted with identical alkyl ($R^{17}$) groups can be prepared from the diacid by reacting the diacid with a trialkyloxonium tetrafluoroborate, e.g., $R^{17}{}_3O[BF_4]$, in methylene chloride at ambient temperature, in the presence of diisopropylethylamine. To obtain esters with differing $R^{17}$ alkyl groups the mixed acid—ester product obtained in scheme 3 is employed as the starting material. In this embodiment the acid group is esterified as set forth in reaction scheme 2. However, a trialkyloxonium tetrafluoroborate having a differing alkyl group than the alkyl group already present in the ester functionality is employed.

It should be noted that the foregoing monomers containing the precursor functionalities can be converted to the desired functional groups before they are polymerized or the monomers can be first polymerized and then the respective polymers containing the precursor functional substituents can then be post reacted to give the desired functionality.

It is contemplated within the scope of this invention that the monomers described under Formulae I to V wherein m, p, q, r, and s is 0 the methylene bridge unit can be replaced by oxygen to give 7-oxo-norbornene derivatives.

It is also contemplated that for applications at 248 nm wave length and above $R^5$ to $R^{16}$ and $R^{11}$ in Formulae II, III, and IV can be aromatic such as phenyl.

Polymers

One or more of the acid labile substituted polycyclic monomers described under Formula I can be polymerized alone or in combination with one or more of the polycyclic monomers described under Formulae II, III, IV, and V. It is also contemplated that the polycyclic monomers of Formulae I to V can be copolymerized with carbon monoxide to afford alternating copolymers of the polycyclic and carbon monoxide. Copolymers of norbornene having pendant carboxylic acid groups and carbon monoxide have been described in U.S. Pat. No. 4,960,857 the disclosure of which is hereby incorporated by reference. The monomers of Formulae I to V and carbon monoxide can be copolymerized in the presence of a palladium containing catalyst system as described in *Chem. Rev.* 1996, 96, 663–681. It should be readily understood by those skilled in the art that the alternating copolymers of polycyclic/carbon monoxide can exist in either the keto or spiroketal isomeric form. Accordingly, the present invention contemplates homopolymers and copolymers containing random repeating units derived (polymerized) from a monomer or monomers represented by Formula I, copolymers containing random repeating units derived (polymerized) from a monomer(s) represented by Formula I in optional combination with any monomer(s) represented by Formulae II to V. In addition, the present invention contemplates alternating copolymers containing repeating units derived (polymerized) from carbon monoxide and a monomer(s) represented by Formulae I to V.

The polymers of the present invention are the key ingredient of the composition. The polymer will generally comprise about 5 to 100 mole % of the monomer (repeating unit) that contains the acid labile group component. Preferably the polymer contains about 20 to 90 mole % of the monomer that contains the acid labile group. More preferably the polymer contains about 30 to 70 mole % of the monomeric unit that contains the acid labile functionality. The remainder of polymer composition is made up of repeating units polymerized from the optional monomers set forth above under Formulae II to V. The choice and the amount of specific monomers employed in the polymer can be varied according to the properties desired. For example, by varying the amount of carboxylic acid functionality in the polymer backbone, the solubility of the polymer to various developing solvents can be adjusted as desired. Monomers containing the ester functionality can be varied to enhance the mechanical properties of the polymer and radiation sensitivity of the system. Finally, the glass transition temperature properties of the polymer can be adjusted by incorporating cyclic repeating units that contain long chain alkyl groups such as decyl.

There are several routes to polymerize cyclic olefin monomers such as norbornene and higher cyclic (polycyclic) monomers containing the norbornene moiety. These include:

(1) ring-opening metathesis polymerization (ROMP); (2) ROMP followed by hydrogenation; and (3) addition polymerization. Each of the foregoing routes produces polymers with specific structures as shown in the diagram 1 below:

Diagram 1

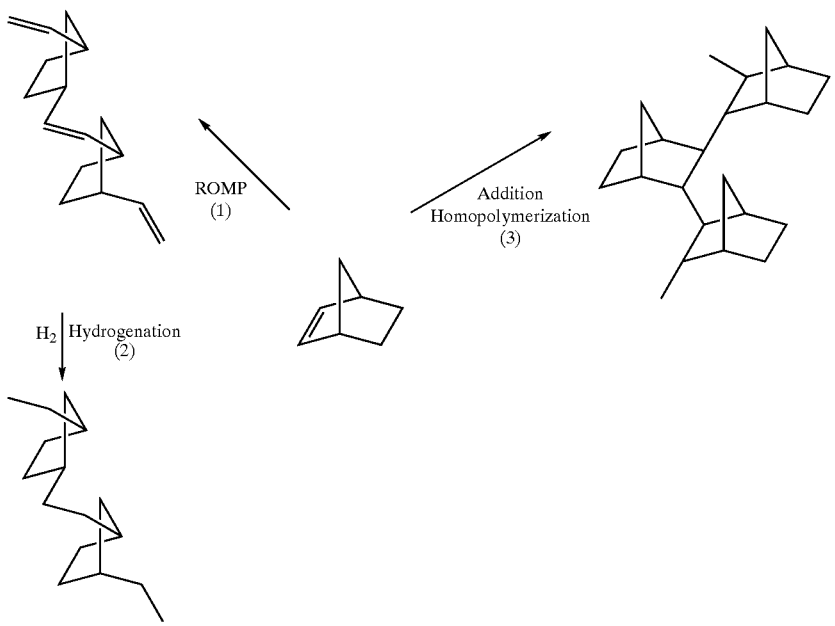

A ROMP polymer has a different structure than that of an addition polymer. A ROMP polymer contains a repeat unit with one less cyclic unit than did the starting monomer. The repeat units are linked together in an unsaturated backbone as shown above. Because of this unsaturation the polymer preferably should subsequently be hydrogenated to confer oxidative stability to the backbone. Addition polymers on the other hand have no C=C unsaturation in the polymer backbone despite being formed from the same monomer.

The monomers of this invention can be polymerized by addition polymerization and by ring-opening metathesis polymerization (ROWP) preferably with subsequent hydrogenation. The cyclic polymers of the present invention are represented by the following structures:

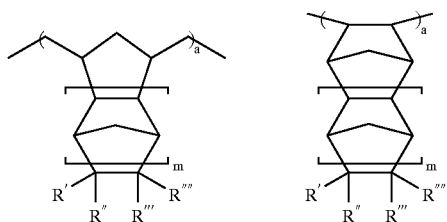

wherein R' to R"" independently represents $R^1$ to $R^{19}$ as defined in Formulae I to V above, m is an integer from 0 to 5 and a represents the number of repeating units in the polymer backbone.

The ROMP polymers of the present invention are polymerized in the presence of a metathesis ring-opening polymerization catalyst in an appropriate solvent. Methods of polymerizing via ROMP and the subsequent hydrogenation of the ring-opened polymers so obtained are disclosed in U.S. Pat. Nos. 5,053,471 and 5,202,388 which are incorporated herein by reference.

In one ROMP embodiment the polycyclic monomers of the invention can be polymerized in the presence of a single component ruthenium or osmium metal carbene complex catalyst such as those disclosed in WO 95-US9655. The monomer to catalyst ratio employed should range from about 100:1 to about 2,000:1, with a preferred ratio of about 500:1. The reaction can be conducted in halohydrocarbon solvent such as dichloroethane, dichloromethane, chlorobenzene and the like or in a hydrocarbon solvent such as toluene. The amount of solvent employed in the reaction medium should be sufficient to achieve a solids content of about 5 to about 40 weight percent, with 6 to 25 weight percent solids to solvent being preferred. The reaction can be conducted at a temperature ranging from about 0° C. to about 60° C., with about 20° C. to 50° C. being preferred.

A preferred metal carbene catalyst is bis (tricyclohexylphosphine)benzylidene ruthenium. Surprisingly and advantageously, it has been found that this catalyst can be utilized as the initial ROMP reaction catalyst and as an efficient hydrogenation catalyst to afford an essentially saturated ROMP polymer. No additional hydrogenation catalyst need be employed. Following the initial ROMP reaction, all that is needed to effect the hydrogenation of the polymer backbone is to maintain hydrogen pressure over the reaction medium at a temperature above about 100° C. but lower than about 220° C., preferably between about 150 to about 200° C.

The addition polymers of the present invention can be prepared via standard free radical solution polymerization methods that are well-known by those skilled in the art. The monomer of Formulae I to V can be homopolymerized or copolymerized in the presence of maleic anhydride. Free radical polymerization techniques are set forth in the *Encyclopedia of Polymer Science*, John Wiley & Sons, 13, 708 (1988).

Alternatively, and preferably, the monomers of this invention are polymerized in the presence of a single or multicomponent catalyst system comprising a Group VIII metal ion source (preferably palladium or nickel). Surprisingly, it has been found that the addition polymers so produced possess excellent transparency to deep UV light (193 nm) and exhibit excellent resistance to reactive ion etching.

The preferred polymers of this invention are polymerized from reaction mixtures comprising at least one polycyclic monomer selected from Formula I, a solvent, a catalyst system containing a Group VIII metal ion source, and an optional chain transfer agent. The catalyst system can be a preformed single component Group VIII metal based catalyst or a multicomponent Group VIII metal catalyst.

Single Component Systems

In one embodiment, the single component catalyst system of this invention comprises a Group VIII metal cation complex and a weakly coordinating counteranion as represented by the following formula:

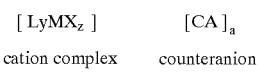

wherein L represents a ligand containing 1, 2, or 3 π-bonds; M represents a Group VIII transition metal; X represents a ligand containing 1 σ-bond and between 0 to 3 π-bonds; y is 0, 1, or 2 and z is 0 or 1 and wherein y and z cannot both be 0 at the same time, and when y is 0, a is 2 and when y is 1, a is 1; and CA is a weakly coordinating counteranion.

The phrase "weakly coordinating counteranion" refers to an anion which is only weakly coordinated to the cation, thereby remaining sufficiently labile to be displaced by a neutral Lewis base. More specifically the phrase refers to an anion which when functioning as a stabilizing anion in the catalyst system of this invention does not transfer an anionic substituent or fragment thereof to the cation, thereby forming a neutral product. The counteranion is non-oxidative, non-reducing, non-nucleophilic, and relatively inert.

L is a neutral ligand that is weakly coordinated to the Group VIII metal cation complex. In other words, the ligand is relatively inert and is readily displaced from the metal cation complex by the inserting monomer in the growing polymer chain. Suitable π-bond containing ligands include ($C_2$ to $C_{12}$) monoolefinic (e.g., 2,3-dimethyl-2-butene), dioolefinic ($C_4$ to $C_{12}$) (e.g., norbornadiene) and ($C_6$ to $C_{20}$) aromatic moieties. Preferably ligand L is a chelating bidentate cyclo($C_6$ to $C_{12}$) diolefin, for example cyclooctadiene (COD) or dibenzo COD, or an aromatic compound such as benzene, toluene, or mesitylene.

Group VIII metal M is selected from Group VIII metals of the Periodic Table of the Elements. Preferably M is selected from the group consisting of nickel, palladium, cobalt, platinum, iron, and ruthenium. The most preferred metals are nickel and palladium.

Ligand X is selected from (i) a moiety that provides a single metal-carbon σ-bond (no π bonds) to the metal in the cation complex or (ii) a moiety that provides a single metal carbon σ-bond and 1 to 3 π-bonds to the metal in the cation complex. Under embodiment (i) the moiety is bound to the Group VIII metal by a single metal-carbon σ-bond and no π-bonds. Representative ligands defined under this embodiment include ($C_1$ to $C_{10}$) alkyl moieties selected from methyl, ethyl, linear and branched moieties such as propyl, butyl, pentyl, neopentyl, hexyl, heptyl, octyl, nonyl and decyl and ($C_7$ to $C_{15}$) aralkyl such as benzyl. Under embodiment (ii) generally defined above, the cation has a hydrocarbyl group directly bound to the metal by a single metal-carbon σ-bond, and also by at least one, but no more than three π-bonds. By hydrocarbyl is meant a group that is capable of stabilizing the Group VIII metal cation complex by providing a carbon-metal σ-bond and one to three olefinic π-bonds that may be conjugated or non-conjugated. Representative hydrocarbyl groups are ($C_3$ to $C_{20}$) alkenyl which may be non-cyclic, monocyclic, or polycyclic and can be substituted with linear and branched ($C_1$ to $C_{20}$) alkoxy, ($C_6$ to $C_{15}$) aryloxy or halo groups (e.g., Cl and F).

Preferably X is a single allyl ligand, or, a canonical form thereof, which provides a σ-bond and a π-bond; or a compound providing at least one olefinic π-bond to the metal, and a σ-bond to the metal from a distal carbon atom, spaced apart from either olefinic carbon atom by at least two carbon-carbon single bonds (embodiment iii).

It should be readily apparent to those skilled in the art that when ligand L or X is absent (i.e., y or z is zero), the metal cation complex will be weakly ligated by the solvent in which the reaction was carried out. Representative solvents include but are not limited to halogenated hydrocarbons such as carbon tetrachloride, chloroform, dichloromethane, 1,2-dichloroethane and aromatic solvents such as benzene, toluene, mesitylene, chlorobenzene, and nitrobenzene, and the like. A more detailed discussion on appropriate solvents will follow.

Selected embodiments of the Group VIII metal cation complexes of the single component catalyst systems of this invention are shown below.

Structure VII illustrates embodiment (i) wherein ligand X is a methyl group that is bound to the metal via a single metal-carbon σ-bond, and ligand L is COD that is weakly coordinated to the palladium metal via two olefinic π-bonds. In the structure below M preferably represents palladium or nickel.

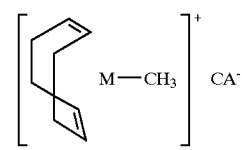

VII

Structures VIII, IX, and X illustrate various examples of embodiment (ii) wherein X is an allyl group that is bound to the metal (palladium is shown for illustrative purposes only) via a single metal-carbon σ-bond and at least one but no more than three π-bonds.

In Structure VIII, L is not present but an aromatic group providing three π-bonds is weakly coordinated to the palladium metal; X is an allyl group providing a single metal-carbon σ-bond and an olefinic π-bond to the palladium.

In Structure IX, L is COD and X is an allyl group providing a metal-carbon σ-bond and an olefinic π-bond to the palladium.

Structure X illustrates an embodiment wherein ligand X is an unsaturated hydrocarbon group that provides a metal-carbon σ-bond, a conjugated π-bond and two additional π-bonds to the palladium; L is absent.

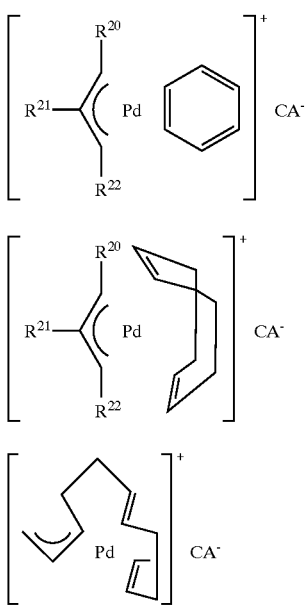

VIII

IX

X

Substituents $R^{20}$, $R^{21}$, $R^{22}$ will be described in detail below.

Structures XI and XII illustrate examples of embodiment (iii) wherein L is COD and X is a ligand that provides at least one olefinic π-bond to the Group VIII metal and a σ-bond to the metal from a distal carbon atom, spaced apart from either olefinic carbon atom by at least two carbon-carbon single bonds.

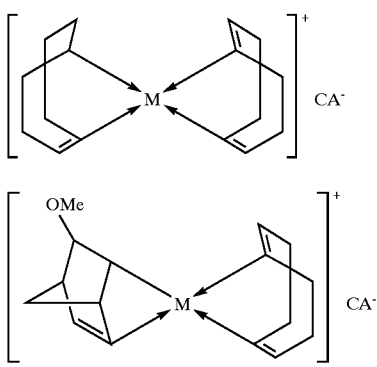

XI

XII

The above-described Group VIII cation complexes are associated with a weakly coordinating or non-coordinating counteranion, CA⁻, which is relatively inert, a poor nucleophile and provides the cation complex with essential solubility in the reaction solvent. The key to proper anion design requires that it be labile, and stable and inert toward reactions with the cationic Group VIII metal complex in the final catalyst species and that it renders the single component catalyst soluble in the solvents of this invention. The anions which are stable toward reactions with water or Brønsted acids, and which do not have acidic protons located on the exterior of the anion (i.e., anionic complexes which do not react with strong acids or bases) possess the stability necessary to qualify as a stable anion for the catalyst system. The properties of the anion which are important for maximum lability include overall size, and shape (i.e., large radius of curvature), and nucleophilicity.

In general, a suitable anion may be any stable anion which allows the catalyst to be dissolved in a solvent of choice, and has the following attributes: (1) the anion should form stable salts with the aforementioned Lewis acid, Brønsted acids, reducible Lewis Acids, protonated Lewis bases, thallium and silver cations; (2) the negative charge on the anion should be delocalized over the framework of the anion or be localized within the core of the anion; (3) the anion should be a relatively poor nucleophile; and (4) the anion should not be a powerful reducing or oxidizing agent.

Anions that meet the foregoing criteria can be selected from the group consisting of a tetrafluoride of Ga, Al, or B; a hexafluoride of P, Sb, or As; perfluoro-acetates, propionates and butyrates, hydrated perchlorate; toluene sulfonates, and trifluoromethyl sulfonate; and substituted tetraphenyl borate wherein the phenyl ring is substituted with fluorine or trifluoromethyl moieties. Selected examples of counteranions include $BF_4^-$, $PF_6^-$, $AlF_3O_3SCF_3^-$, $SbF_6^-$, $^{SbF}5SO_3F^-$, $AsF_6^-$, trifluoroacetate ($CF_3CO_2^-$), pentafluoropropionate ($C_2F_5CO_2^-$), heptafluorobutyrate ($CF_3CF_2CF_2CO_2^-$), perchlorate ($ClO_4^-\cdot H_2O$), p-toluenesulfonate (p-$CH_3C_6H_4SO_3^-$) and tetraphenyl borates represented by the formula:

wherein R' independently represents hydrogen, fluorine and trifluoromethyl and n is 1 to 5.

A preferred single component catalyst of the foregoing embodiment are represented by the formula:

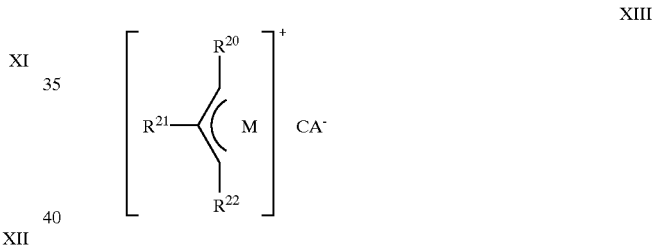

XIII

The catalyst comprises a π-allyl Group VIII metal complex with a weakly coordinating counteranion. The allyl group of the metal cation complex is provided by a compound containing allylic functionality which functionality is bound to the M by a single carbon-metal σ-bond and an olefinic π-bond. The Group VIII metal M is preferably selected from nickel and palladium with palladium being the most preferred metal. Surprisingly, it has been found that these single component catalysts wherein M is palladium and the cation complex is devoid of ligands other than the allyl functionality (i.e., $L_y$=0), exhibit excellent activity for the polymerization of functional polycyclic monomers such as the silyl containing monomers of this invention. As discussed above, it will be understood that the catalysts are solvated by the reaction diluent which diluent can be considered very weak ligands to the Group VIII metal in the cation complex.

Substituents $R^{20}$, $R^{21}$, and $R^{22}$ on the allyl group set forth above in Structures VIII, IX and XIII are each independently hydrogen, branched or unbranched ($C_1$ to $C_5$) alkyl such as methyl, ethyl, n-propyl, isopropyl, and t-butyl, ($C_6$ to $C_{14}$) aryl, such as phenyl and naphthyl, ($C_7$ to $C_{10}$) aralkyl such as benzyl, —COOR$^{16}$, —(CH$_2$)$_n$OR$^{16}$, Cl and ($C_5$ to $C_6$) cycloaliphatic, wherein $R^{16}$ is ($C_1$ to $C_5$) alkyl, such as methyl, ethyl, n-propyl, isopropyl, n-butyl and i-butyl, and n is 1 to 5.

Optionally, any two of $R^{20}$, $R^{21}$, and $R^{22}$ may be linked together to form a cyclic- or multi-cyclic ring structure. The cyclic ring structure can be carbocyclic or heterocyclic. Preferably any two of $R^{20}$, $R^{21}$, and $R^{22}$ taken together with the carbon atoms to which they are attached form rings of 5 to 20 atoms. Representative heteroatoms include nitrogen, sulfur and carbonyl. Illustrative of the cyclic groups with allylic functionality are the following structures:

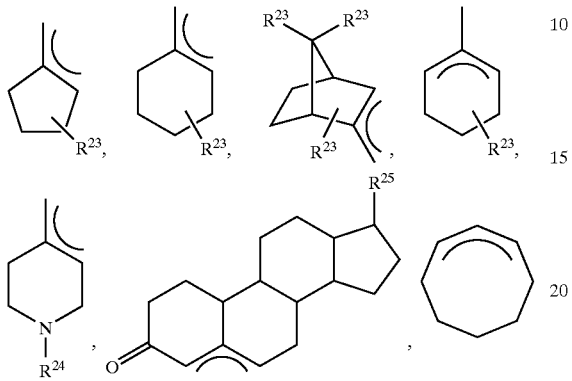

wherein $R^{23}$ is hydrogen, linear or branched ($C_1$ to $C_5$) alkyl such as methyl, ethyl, n-propyl, isopropyl, n-butyl, isobutyl, and pentyl, $R^{24}$ is methylcarbonyl, and $R^{25}$ is linear or branched ($C_1$ to $C_{20}$) alkyl. Counteranion $CA^-$ is defined as above.

Additional examples of π-allyl metal complexes are found in R. G. Guy and B. L. Shaw, *Advances in Inorganic Chemistry and Radiochemistry*, Vol. 4, Academic Press Inc., New York, 1962; J. Birmingham, E. de Boer, M. L. H. Green, R. B. King, R. Köster, P. L. I. Nagy, G. N. Schrauzer, *Advances in Organometallic Chemistry*, Vol. 2, Academic Press Inc., New York, 1964; W. T. Dent, R. Long and A. J. Wilkinson, J. Chem. Soc., (1964) 1585; and H. C. Volger, Rec. Trav. Chim. Pay Bas, 88 (1969) 225; which are all hereby incorporated by reference.

The single component catalyst of the foregoing embodiment can be prepared by combining a ligated Group VIII metal halide component with a salt that provides the counteranion for the subsequently formed metal cation complex. The ligated Group VIII metal halide component, counteranion providing salt, and optional π-bond containing component, e.g., COD, are combined in a solvent capable of solvating the formed single component catalyst. The solvent utilized is preferably the same solvent chosen for the reaction medium. The catalyst can be preformed in solvent or can be formed in situ in the reaction medium.

Suitable counteranion providing salts are any salts capable of providing the counteranions discussed above. For example, salts of sodium, lithium, potassium, silver, thallium, and ammonia, wherein the anion is selected from the counteranions ($CA^-$) defined previously. Illustrative counteranion providing salts include $TIPF_6$, $AgPF_6$, $AgSbF_6$, $LiBF_4$, $NH_4PF_6$, $KAsF_6$, $AgC_2F_5CO_2$, $AgBF_4$, $AgCF_3CO_2$, $AgClO_4 \cdot H_2O$, $AgAsF_6$, $AgCF_3CF_2CF_2CO_2$, $AgC_2F_5CO_2$, $(C_4H_9)_4NB(C_6F_5)_4$, and

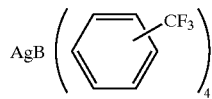

The specific catalyst: $[allyl-Pd-COD]^+ PF_6^-$ is preformed by forming a ligated palladium halide component, i.e., bis(allyl Pd bromide), which is then subjected to scission with a halide abstracting agent in the form of a counteranion providing salt, i.e., $TIPF_6$ in the presence of COD. The reaction sequence is written as follows:

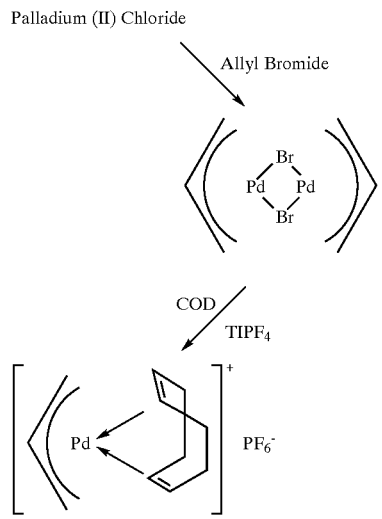

When partitioned, only one COD ligand remains, which is bonded by two π-bonds to the palladium. The allyl functionality is bonded by one metal-carbon σ-bond and one π-bond to the palladium.

For the preparation of the preferred π-allyl Group VIII metal/counteranion single component catalysts represented in Structure XMI above, i.e., when M is palladium, allylpalladium chloride is combined with the desired counteranion providing salt, preferably silver salts of th e counteranion, in an approprate solvent. The chloride ligand comes off the allyl palladium complex as a precipitate of silver chloride (AgCl) which can be filtered ou t of the solution. The allylpalladium cation complex/counteranion single component catalyst remains in solution. The palladium metal is devoid of any ligands apart from the allylic functionality.

An alternative single component catalyst that is useful in the present invention is represented by the formula below:

wherein $R^{27}$ independently represents linear and branched ($C_1$ to $C_{10}$) alkyl and $CA^-$ is a counteranion defined as above.

Another single component catalyst system useful in making polymers utilized in this invention is represented by the formula:

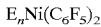

wherein n is 1 or 2 and E represents a neutral 2 electron donor ligand. When n is 1, E preferably is a π-arene ligand such as toluene, benzene, and mesitylene. When n is 2, E is preferably selected from diethylether, tetrahydrofuran (THF), and dioxane. The ratio of monomer to catalyst in the reaction medium can range from about 2000:1 to about 100:1. The reaction can be run in a hydrocarbon solvent such as cyclohexane, toluene, and the like at a temperature range from about 0° C. to about 70° C., preferably 10° C. to about 50° C., and more preferably from about 20° C. to about 40° C. Preferred catalysts of the above formula are (toluene)bis (perfluorophenyl) nickel, (mesitylene)bis(perfluorophenyl) nickel, (benzene)bis(perfluorophenyl) nickel, bis (tetrahydrofuran)bis(perfluorophenyl) nickel and bis(dioxane)bis(perfluorophenyl) nickel.

Multicomponent Systems

The multicomponent catalyst system embodiment of the present invention comprises a Group VIII metal ion source, in combination with one or both of an organometal cocatalyst and a third component. The cocatalyst is selected from organoaluminum compounds, dialkylaluminum hydrides, dialkyl zinc compounds, dialkyl magnesium compounds, and alkyllithium compounds.

The Group VIII metal ion source is preferably selected from a compound containing nickel, palladium, cobalt, iron, and ruthenium with nickel and palladium being most preferred. There are no restrictions on the Group VIII metal compound so long as it provides a source of catalytically active Group VIII metal ions. Preferably, the Group VIII metal compound is soluble or can be made to be soluble in the reaction medium.

The Group VIII metal compound comprises ionic and/or neutral ligand(s) bound to the Group VIII metal. The ionic and neutral ligands can be selected from a variety of monodentate, bidentate, or multidentate moieties and combinations thereof Representative of the ionic ligands that can be bonded to the metal to form the Group VIII compound are anionic ligands selected from the halides such as chloride, bromide, iodide or fluoride ions; pseudohalides such as cyanide, cyanate, thiocyanate, hydride; carbanions such as branched and unbranched ($C_1$ to $C_{40}$) alkylanions, phenyl anions; cyclopentadienylide anions; π-allyl groupings; enolates of β-dicarbonyl compounds such as acetylacetonate (4-pentanedionate), 2,2,6,6-tetramethyl-3,5-heptanedionate, and halogenated acetylacetonoates such as 1,1,1,5,5,5-hexafluoro-2,4-pentanedionate, 1,1,1-trifluoro-2,4, pentanedionate; anions of acidic oxides of carbon such as carboxylates and halogenated carboxylates (e.g., acetates, 2-ethylhexanoate, neodecanoate, trifluoroacetate, etc.) and oxides of nitrogen (e.g., nitrates, nitrites, etc.) of bismuth (e.g., bismuthate, etc.), of aluminum (e.g., aluminates, etc.), of silicon (e.g., silicate, etc.), of phosphorous (e.g., phosphates, phosphites, phosphines, etc.) of sulfur (e.g., sulfates such as triflate, p-toluene sulfonate, sulfites, etc.); ylides; amides; imides; oxides; phosphides; sulfides; ($C_6$ to $C_{24}$) aryloxides, ($C_1$ to $C_{20}$) alkoxides, hydroxide, hydroxy ($C_1$ to $C_{20}$) alkyl; catechols; oxalate; chelating alkoxides and aryloxides. Palladium compounds can also contain complex anions such as $PF_6^-$, $AlF_3O_3SCF_3^-$, $SbF_6^-$ and compounds represented by the formulae:

$$Al(R''')_4^-, B(X)_4^-$$

wherein R''' and X independently represent a halogen atom selected from Cl, F, I, and Br, or a substituted or unsubstituted hydrocarbyl group. Representative of hydrocarbyl are ($C_1$ to $C_{25}$) alkyl such as methyl, ethyl, propyl, butyl, pentyl, hexyl, heptyl, octyl nonyl, decyl, undecyl, dodecyl, tridecyl, tetradecyl, pentadecyl, hexadecyl, heptadecyl, octadecyl, nonodecyl, eicosyl, heneicosyl, docosyl, tricosyl, tetracosyl, pentacosyl, and isomeric forms thereof; ($C_2$ to $C_{25}$) alkenyl such as vinyl, allyl, crotyl, butenyl, pentenyl, hexenyl, octenyl, nonenyl, decenyl, undecenyl, dodecenyl, tridecenyl, tetradecenyl pentadecenyl, hexadecenyl, heptadecenyl, octadecenyl, nonadecenyl, pentacosenyl, and isomeric forms thereof ($C_6$ to $C_{25}$) aryl such as phenyl, tolyl, xylyl, naphthyl, and the like; ($C_7$ to $C_{25}$) aralkyl such as benzyl, phenethyl, phenpropyl, phenbutyl, phenhexyl, napthoctyl, and the like; ($C_3$ to $C_8$) cycloalkyl such as cyclopropyl, cyclobutyl, cyclopentyl, cyclohexyl, cycloheptyl, cyclooctyl, 2-norbornyl, 2-norbornenyl, and the like. In addition to the above definitions X represents the radical:

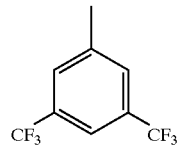

The term "substituted hydrocarbyl" means the hydrocarbyl group as previously defined wherein one or more hydrogen atoms have been replaced with a halogen atom such as Cl, F, Br, and I (e.g., as in the perfluorophenyl radical); hydroxyl; amino; alkyl; nitro; mercapto, and the like.

The Group VIII metal compounds can also contain cations such as, for example, organoammonium, organoarsonium, organophosphonium, and pyridinium compounds represented by the formulae:

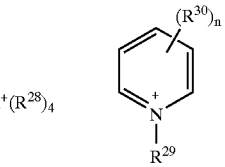

$$A^+(R^{28})_4$$

wherein A represents nitrogen, arsenic, and phosphorous and the $R^{28}$ radical can be independently selected from hydrogen, branched or unbranched ($C_1$ to $C_{20}$) alkyl, branched or unbranched ($C_2$ to $C_{20}$) alkenyl, and ($C_5$ to $C_{16}$) cycloalkyl, e.g., cyclopentyl, cyclohexyl, cycloheptyl, cyclooctyl, and the like. $R^{29}$ and $R^{30}$ are independently selected from hydrogen, branched and unbranched ($C_1$ to $C_{50}$) alkyl, linear and branched ($C_2$ to $C_{50}$) alkenyl and ($C_5$ to $C_{16}$) cycloalkyl groups as defined above; and n is 1 to 5, preferably n is 1, 2, or 3, most preferably n is 1. The $R^{30}$ radicals preferably are attached to positions 3, 4, and 5 on the pyridine ring.

It should be noted that increasing the sum of the carbon atoms contained in the $R^{28}$ radicals confers better solubility of the transition metal compound in organic media such as organic solvents and polycyclic the monomer. Preferably, the $R^{28}$ radicals are selected from ($C_1$ to $C_{18}$) alkyl groups wherein the sum of carbon atoms for all $R^{28}$ radicals is 15 to 72, preferably 25 to 48, more preferably 21 to 42. The $R^{21}$ radical is preferably selected from linear and branched ($C_1$ to $C_{50}$) alkyl, more preferably ($C_{10}$ to $C_{40}$) alkyl. $R^{30}$ is preferably selected from linear and branched ($C_1$ to $C_{40}$) alkyl, more preferably ($C_2$ to $C_{30}$) alkyl.

Specific examples of organoammonium cations include tridodecylammonium, methyltricaprylammonium, tris(tridecyl)ammonium and trioctylammonium. Specific examples of organoarsonium and organophosphonium cations include tridodecylarsonium and phosphonium, methyltricaprylarsonium and phosphonium, tris(tridecyl)arsonium and phosphonium, and trioctylarsonium and phosphonium. Specific pyridinium cations include eicosyl-4-(1-butylpentyl)pyridinium, docosyl-4-(13-pentacosyl)pyridinium, and eicosyl-4-(1-butylpentyl)pyridinium.

Suitable neutral ligands which can be bonded to the palladium transition metal are the olefins; the acetylenes; carbon monoxide; nitric oxide, nitrogen compounds such as ammonia, alkylisocyanide, alkylisocyanate, alkylisothiocyanate; pyridines and pyridine derivatives (e.g., 1,10- phenanthroline, 2,2'-dipyridyl), 1,4-dialkyl-1,3-diazabutadienes, 1,4-diaryl-1,3-diazabutadienes and amines such as represented by the formulae:

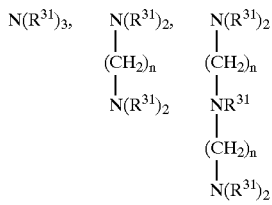

wherein $R^{31}$ is independently hydrocarbyl or substituted hydrocarbyl as previously defined and n is 2 to 10. Ureas; nitriles such as acetonitrile, benzonitrile and halogenated derivatives thereof; organic ethers such as dimethyl ether of diethylene glycol, dioxane, tetrahydrofuran, furan diallyl ether, diethyl ether, cyclic ethers such as diethylene glycol cyclic oligomers; organic sulfides such as thioethers (diethyl sulfide); arsines; stibines; phosphines such as triarylphosphines (e.g., triphenylphosphine), trialkylphosphines (e.g., trimethyl, triethyl, tripropyl, tripentacosyl, and halogenated derivatives thereof), bis(diphenylphosphino)ethane, bis(diphenylphosphino)propane, bis(dimethylphosphino)propane, bis(diphenylphosphino)butane, (S)-(−)2,2'-bis(diphenylphosphino)-1,1'-binaphthyl, (R)-(+)-2,2'-bis(diphenylphosphino)-1,1'-binaphthyl, and bis(2-diphenylphosphinoethyl)phenylphosphine; phosphine oxides, phosphorus halides; phosphites represented by the formula:

$$P(OR^{31})_3$$

wherein $R^{31}$ independently represents a hydrocarbyl or substituted hydrocarbyl as previously defined; phosphorus oxyhalides; phosphonates; phosphonites, phosphinites, ketones; sulfoxides such as ($C_1$ to $C_{20}$) alkylsulfoxides; ($C_6$ to $C_{20}$) arylsulfoxides, ($C_7$ to $C_{40}$) alkarylsulfoxides, and the like. It should be recognized that the foregoing neutral ligands can be utilized as optional third components as will be described hereinbelow.

Examples of Group VIII transition metal compounds suitable as the Group VIII metal ion source include: palladium ethylhexanoate, trans-Pd $Cl_2(PPh_3)_2$, palladium (II) bis(trifluoroacetate), palladium (II) bis(acetylacetonate), palladium (II) 2-ethylhexanoate, $Pd(acetate)_2(PPh_3)_2$, palladium (II) bromide, palladium (II) chloride, palladium (II) iodide, palladium (II) oxide, monoacetonitriletris(triphenylphosphine) palladium (II) tetrafluoroborate, tetrakis(acetonitrile) palladium (II) tetrafluoroborate, dichlorobis(acetonitrile) palladium (II), dichlorobis(triphenylphosphine) palladium (II), dichlorobis(benzonitrile) palladium (II), palladium acetylacetonate, palladium bis(acetonitrile) dichloride, palladium bis(dimethylsulfoxide) dichloride, nickel acetylacetonates, nickel carboxylates, nickel dimethylglyoxime, nickel ethylhexanoate, $NiCl_2(PPh_3)_2$, $NiCl_2(PPh_2CH_2)_2$, $(P(cyclohexyl)_3)H$ $Ni(Ph_2P(C_6H_4)CO_2)$, $(PPh_3)$ $(C_6H_5)Ni$ $(Ph_2$ $PCH=C(O)Ph)$, bis(2,2,6,6-tetramethyl-3,5-heptanedionate) nickel (II), nickel (II) hexafluoroacetylacetonate tetrahydrate, nickel (II) trifluoroacetylacetonate dihydrate, nickel (II) acetylacetonate tetrahydrate, nickelocene, nickel (II) acetate, nickel bromide, nickel chloride, dichlorohexyl nickel acetate, nickel lactate, nickel oxide, nickel tetrafluoroborate, bis(allyl)nickel, bis(cyclopentadienyl)nickel, cobalt neodecanoate, cobalt (II) acetate, cobalt (II) acetylacetonate, cobalt (III) acetylacetonate, cobalt (II) benzoate, cobalt chloride, cobalt bromide, dichlorohexyl cobalt acetates, cobalt (II) stearate, cobalt (II) tetrafluoroborate, iron napthenate, iron (II) chloride, iron (HI) chloride, iron (II) bromide, iron (III) bromide, iron (II) acetate, iron (III) acetylacetonate, ferrocene, ruthenium tris(triphenylphosphine) dichloride, ruthenium tris(triphenylphosphine) hydrido chloride, ruthenium trichloride, ruthenium tetrakis(acetonitrile) dichloride, ruthenium tetrakis(dimethylsulfoxide) dichloride, rhodium chloride, rhodium tris(triphenylphosphine) trichloride.

The organoaluminum component of the multicomponent catalyst system of the present invention is represented by the formula:

$$AlR^{32}_{3-x}Q_x$$

wherein $R^{32}$ independently represents linear and branched ($C_1$ to $C_{20}$) alkyl, ($C_6$ to $C_{24}$) aryl, ($C_7$ to $C_{20}$) aralkyl, ($C_3$ to $C_{10}$) cycloalkyl; Q is a halide or pseudohalide selected from chlorine, fluorine, bromine, iodine, linear and branched ($C_1$ to $C_{20}$) alkoxy, ($C_6$ to $C_{24}$) aryloxy; and x is 0 to 2.5, preferably 0 to 2.

Representative organoaluminum compounds include trialkylaluminums such as trimethylaluminur, triethylaluminum, tripropylaluminum, triisopropylaluminum, triisobutylaluminum, tri-2-methylbutylaluminum, tri-3-methylbutylaluminum, tri-2-methylpentylaluminum, tri-3-methylpentylaluminum, tri-4-methylpentylaluminum, tri-2-methylhexylaluminum, tri-3-methylhexylaluminum, trioctylaluminum, tris-2-norbornylaluminum, and the like; dialkylaluminum halides such as dimethylaluminum chloride, diethylaluminum chloride, diisopropylaluminum chloride, diisobutylaluminum chloride, and the like; monoalkylaluminum dihalides such as methylaluminum dichloride, ethylaluminum dichloride, ethylaluminum diiodide, propylaluminum dichloride, isopropylaluminum dichloride, butylaluminum dichloride, isobutylaluminum dichloride, and the like; and alkylaluminum sesquihalides such as methylaluminum sesquichloride, ethylaluminum sesquichloride, propylaluminum sesquichloride, isobutylaluminum sesquichloride, and the like.

The dialkylaluminum hydride is selected from linear and branched ($C_1$ to $C_{10}$) dialkylaluminum hydride, with diisobutylaluminum hydride being a preferred dialkylaluminum hydride compound.

The dialkyl zinc compounds are selected from linear and branched ($C_1$ to $C_{10}$) dialkyl zinc compounds with diethyl zinc being preferred. The dialkyl magnesium compounds are selected from linear and branched ($C_1$ to $C_{10}$) dialkyl magnesium with dibutyl magnesium being the most preferred. The alkyl lithiums are selected from linear and branched ($C_1$ to $C_{10}$) alkyl lithium compounds. Butyllithium is the preferred alkyl lithium.

In the practice of the present invention, the catalytic system obtained from the Group VIII metal ion source is utilized with one or both of a component selected from the group of cocatalyst compounds, and third component compounds.

Examples of third components are Lewis acids such as the $BF_3$.etherate, $TiCl_4$, $SbF_5$, tris(perfluorophenyl)boron, $BCl_3$, $B(OCH_2CH_3)_3$; strong Brønsted acids such as hexafluoroantimonic acid ($HSbF_6$), $HPF_6$ hydrate, trifluoroacetic acid ($CF_3CO_2H$), and $FSO_3H.SbF_5$, $H_2C(SO_2CF_3)_2$ $CF_3SO_3H$, and paratoluenesulfonic acid; halogenated compounds such as hexachloroacetone, hexafluoroacetone, 3-butenoic acid-2,2,3,4,4-pentachlorobutylester, hexafluoroglutaric acid, hexafluoroisopropanol, and chloranil, i.e.,

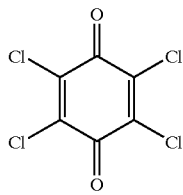

electron donors such as phosphines and phosphites and olefinic electron donors selected from ($C_4$ to $C_{12}$) aliphatic and ($C_6$ to $C_{12}$) cycloaliphatic diolefins, such as butadiene, cyclooctadiene, and norbornadiene.

Acidity of strong Bronsted acids can be gauged by determining their Hammett acidity function $H_0$. A definition of the Hammett acidity function is found in *Advanced Inorganic Chemistry* by F. A. Cotton and G. Wilkinson, Wiley-Interscience, 1988, p. 107.

As set forth above the neutral ligands can be employed as optional third components with electron donating properties.

In one embodiment of the invention, the multicomponent catalyst system can be prepared by a process which comprises mixing the catalyst components, i.e., the Group VIII metal compound, the cocatalyst compound, and third component (if employed), together in a hydrocarbon or halohydrocarbon solvent and then mixing the premixed catalyst system in the reaction medium comprising at least one silyl functional polycyclic monomer. Alternatively, (assuming the optional third component is utilized), any two of the catalyst system components can be premixed in a hydrocarbon or halohydrocarbon solvent and then introduced into the reaction medium. The remaining catalyst component can be added to the reaction medium before or after the addition of the premixed components.

In another embodiment, the multicomponent catalyst system can be prepared in situ by mixing together all of the catalyst components in the reaction medium. The order of addition is not important.

In one embodiment of the multicomponent catalyst system of the present invention, a typical catalyst system comprises a Group VIII transition metal salt, e.g., nickel ethylhexanoate, an organoaluminum compound, e.g., triethylaluminum, and a mixture of third components, e.g., $BF_3$.etherate and hexafluoroantimonic acid ($HSbF_6$), in a preferred molar ratio of Al/$BF_3$.etherate/Ni/acid of 10/9/1/0.5-2. The reaction scheme is written as follows:
1. nickel ethylhexanoate+$HSbF_6$+9$BF_3$.etherate+10 triethylalurinum–Active Catalyst In another embodiment of the multicomponent catalyst system of the invention, the catalyst system comprises a nickel salt, e.g., nickel ethylhexanoate, an organoaluminum compound, e.g., triethylaluminum, and a third component Lewis acid, e.g., tris(perfluorophenyl)boron as shown in the following scheme:
2. nickel ethylhexanoate+tris(perfluorophenyl)boron+ triethylaluminum–Active Catalyst In another embodiment of the multicomponent catalyst system of the invention the third component is a halogenated compound selected from various halogenated activators. A typical catalyst system comprises a Group VIII transition metal salt, an organoaluminum, and a third component halogenated compound as shown below:
3. nickel ethylhexanoate+triethylaluminum+chloranil– Active Catalyst In still another embodiment of the multicomponent catalyst system of this invention no cocatalyst is present. The catalyst system comprises a Group VIII metal salt (e.g. 3-allylnickelbromide dimer and a Lewis acid (e.g. tris (perfluorophenyl)boron as shown below:
4. $\eta^3$-allylnickel chloride+tris(perfluorophenyl)boron– Active Catalyst We have found that the choice of Group VIII metal in the metal cation complex of both the single and multicomponent catalyst systems of this invention influences the microstructure and physical properties of the polymers obtained. For example, we have observed that palladium catalysts typically afford norbornene units which are exclusively 2,3 enchained and showing some degree of tacticity. The polymers catalyzed by the type 2 catalyst systems and the single component catalyst systems of the formula $E_nNi(C_6F_5)_2$ described above contain what we believe to be exclusive 2,7-enchained repeating units. These polymers also contain a perfluorophenyl group at at least one of the two terminal ends of the polymer chain. In other words, a perfluorophenyl moiety can be located at one or both terminal ends of the polymer. In either case the perfluorophenyl group is covalently bonded to and pendant from a terminal polycyclic repeating unit of the polymer backbone.

Reactions utilizing the single and multicomponent catalysts of the present invention are carried out in an organic solvent which does not adversely interfere with the catalyst system and is a solvent for the monomer. Examples of organic solvents are aliphatic (non-polar) hydrocarbons such as pentane, hexane, heptane, octane and decane; alicyclic hydrocarbons such as cyclopentane and cyclohexane; aromatic hydrocarbons such as benzene, chlorobenzene, o-dichlorobenzene, toluene, and xylenes; halogenated (polar) hydrocarbons such as methylene chloride, chloroform, carbon tetrachloride, ethyl chloride, 1,1-dichloroethane, 1,2-dichloroethane, 1,2-dichloroethylene, 1-chloropropane, 2-chloropropane, 1-chlorobutane, 2-chlorobutane, 1-chloro-2-methylpropane, and 1-chloropentane.

The choice of reaction solvent is made on the basis of a number of factors including the choice of catalyst and whether it is desired to run the polymerization as a slurry or solution process. For most of the catalysts described in this invention, the preferred solvents are chlorinated hydrocarbons such as methylene chloride and 1,2-dichloroethane and aromatic hydrocarbons such as chlorobenzene and nitrobenzene, with simple hydrocarbons being less preferred due to the resulting lower conversion of the functional NB-type monomer(s). Surprisingly we have discovered that certain of the catalyst systems, most notably the multicomponent catalysts based on Group VIII metal compounds and alkylaluminum halides, specifically, monoalkylaluminum dihalides, (e.g., ethylaluminum dichloride), and the type 2 catalysts referred to above also give excellent results (and high monomer conversion) when run in simple hydrocarbons such as heptane, cyclohexane, and toluene.

The molar ratio of total monomer to Group VIII metal for the single and multicomponent catalysts can run from 20:1 to 100,000:1, preferably 50:1 to 20,000:1, and most preferably 100:1 to 10,000:1.

In the multicomponent catalyst systems, the cocatalyst metal (e.g., aluminum, zinc, magnesium, and lithium) to Group VIII metal molar ratio ranges from less than or equal to 100:1, preferably less than or equal to 30:1, and most preferably less than or equal to 20:1.

The third component is employed in a molar ratio to Group VIII metal ranging from 0.25:1 to 20:1. When acids are employed as third components, the acid to Group VIII metal range is less than or equal to 4:1, preferably less than or equal to 2:1.

The temperature at which the polymerization reactions of the present invention are carried out typically ranges from −100° C. to 120° C., preferably −60° C. to 90° C., and most preferably −10° C. to 80° C.

The optimum temperature for the present invention is dependent on a number of variables, primarily the choice of catalyst and the choice of reaction diluent. Thus, for any given polymerization the optimum temperature will be experimentally determined taking these variables into account.

In the course of developing these catalyst and polymer systems we have observed that the palladium-carbon bond which links the palladium catalysts to the growing polymer chain is particularly stable. This is a major benefit in polymerizing polycyclic monomers bearing acid labile groups, esters and carboxylic acid functionalities since the palladium catalysts are extremely tolerant to such functionalities. However, this stability also makes it very difficult to remove the palladium catalyst residues from the resulting polymer. During the development of these new compositions, we discovered that the palladium-carbon bond can be conveniently cleaved (resulting in precipitation of palladium metal which can be removed by filtration or centrifugation) using carbon monoxide, preferably in the presence of a protic solvent such as an alcohol, moisture, or a carboxylic acid.

The polymers obtained by the process of the present invention are produced in a molecular weight ($M_n$) range from about 1,000 to about 1,000,000, preferably from about 2,000 to about 700,000, and more preferably from about 5,000 to about 500,000 and most preferably from about 10,000 to about 50,000.

Molecular weight can be controlled by changing the catalyst to monomer ratio, i.e., by changing the initiator to monomer ratio. Lower molecular weight polymers and oligomers may also be formed in the range from about 500 to about 500,000 by carrying out the polymerization in the presence of a chain transfer agent. Macromonomers or oligomers comprising from 4 to 50 repeating units can be prepared in the presence of a CTA (Chain Transfer Agent) selected from a compound having a terminal olefinic double bond between adjacent carbon atoms, wherein at least one of the adjacent carbon atoms has two hydrogen atoms attached thereto. The CTA is exclusive of styrenes (non-styrenes), vinyl ethers (non-vinyl ether) and conjugated dienes. By non-styrenic, non-vinyl ether is meant that compounds having the following structures are excluded from the chain transfer agents of this invention:

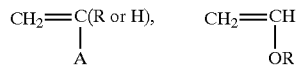

wherein A is an aromatic substituent and R is hydrocarbyl.

The preferred CTA compounds of this invention are represented by the following formula:

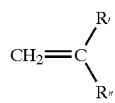

wherein R' and R" independently represent hydrogen, branched or unbranched ($C_1$ to $C_{40}$) alkyl, branched or unbranched ($C_2$ to $C_{40}$) alkenyl, halogen, or the group Of the above chain transfer agents the α-olefins having 2 to 10 carbon atoms are preferred, e.g., ethylene, propylene, 4-methyl-1-pentene, 1-hexene, 1-decene, 1,7-octadiene, and 1,6-octadiene, or isobutylene.

While the optimum conditions for any given result should be experimentally determined by a skilled artisan taking into the account all of the above factors there are a number of general guidelines which can be conveniently utilized where appropriate. We have learned that, in general, α-olefins (e.g., ethylene, propylene, 1-hexene, 1-decene, 4-methyl-1-pentene) are the most effective chain transfer agents with 1,1-disubstituted olefins (e.g., isobutylene) being less efficient. In other words, all other things being equal, the concentration of isobutylene required to achieve a given molecular weight will be much higher than if ethylene were chosen. Styrenic olefins, conjugated dienes, and vinyl ethers are not effective as chain transfer agents due to their propensity to polymerize with the catalysts described herein.

The CTA can be employed in an amount ranging from about 0.10 mole % to over 50 mole % relative to the moles of total NB-type monomer. Preferably, the CTA is employed in the range of 0.10 to 10 mole %, and more preferably from 0.1 to 5.0 mole %. As discussed above, depending on catalyst type and sensitivities, CTA efficiencies and desired end group, the concentration of CTA can be in excess of 50 mole % (based on total NB-functional monomer present), e.g., 60 to 80 mole %. Higher concentrations of CTA (e.g., greater than 100 mole %) may be necessary to achieve the low molecular weight embodiments of this invention such as in oligomer and macromonomer applications. It is important and surprising to note that even such high concentrations the CTA's (with the exception of isobutylene) do not copolymerize into the polymer backbone but rather insert as terminal end-groups on each polymer chain. Besides chain transfer, the process of the present invention affords a way by which a terminal α-olefinic end group can be placed at the end of a polymer chain.

Polymers of the present invention that are prepared in the presence of the instant CTA's have molecular weights ($M_n$) ranging from about 1,000 to about 500,000, preferably from about 2,000 to about 300,000, and most preferably from about 5,000 to about 200,000.

The photoresist compositions of the present invention comprise the disclosed polycyclic compositions, a solvent, and an photosensitive acid generator (photoinitiator). Optionally, a dissolution inhibitor can be added in an amount of up to about 20 weight % of the composition. A suitable dissolution inhibitor is t-butyl cholate (J. V. Crivello et al., Chemically Amplified Electron-Beam Photoresists, *Chem. Mater.*, 1996, 8, 376–381).

Upon exposure to radiation, the radiation sensitive acid generator generates a strong acid. Suitable photoinitiators include triflates (e.g., triphenylsulfonium triflate), pyrogallol (e.g., trimesylate of pyrogallol); onium salts such as triarylsulfonium and diaryliodium hexafluoroantimonates, hexafluoroarsenates, trifluoromethanesulfonates; esters of hydroxyimides, α,α'-bis-sulfonyl-diazomethanes, sulfonate esters of nitro-substituted benzyl alcohols and napthoquinone-4-diazides. Other suitable photoacid initiators are disclosed in Reichmanis et al., *Chem. Mater.* 3, 395, (1991). Compositions containing triarylsulfonium or diaryliodonium salts are preferred because of their sensitivity to deep UV light (193 to 300 nm) and give very high resolution images. Most preferred are the unsubstituted and symmetrically or unsymmetrically substituted diaryliodium or triarylsulfonium salts. The photoacid initiator component comprises about 1 to 100 w/w % to polymer. The preferred concentration range is 5 to 50 w/w %.

The photoresist compositions of the present invention optionally contain a sensitizer capable of sensitizing the photoacid initiator to longer wave lengths ranging from mid UV to visible light. Depending on the intended application, such sensitizers include polycyclic aromatics such as pyrene and perlene. The sensitization of photoacid initiators is well-known and is described in U.S. Pat. Nos. 4,250,053; 4,371,605; and 4,491,628 which are all incorporated herein by reference. The invention is not limited to a specific class of sensitizer or photoacid initiator.

The present invention also relates to a process for generating a positive tone resist image on a substrate comprising the steps of (a) coating a substrate with a film comprising the positive tone resist composition of the present invention; (b) imagewise exposing the film to radiation; and (c) developing the image.

The first step involves coating the substrate with a film comprising the positive tone resist composition dissolved in a suitable solvent. Suitable substrates are comprised of silicon, ceramics, polymer or the like. Suitable solvents include propylene glycol methyl ether acetate (PGMEA) cyclohexanone, butyrolactate, ethyl lactate, and the like. The film can be coated on the substrate using art known techniques such as spin or spray coating, or doctor blading. Preferably, before the film has been exposed to radiation, the film is heated to an elevated temperature of about 90° C. to 150° C. for a short period of time of about 1 min. In the second step of the process, the film is imagewise exposed to radiation suitably electron beam or electromagnetic preferably electromagnetic radiation such as ultraviolet or x-ray, preferably ultraviolet radiation suitably at a wave length of about 193 to 514 nm preferably about 193 nm to 248 nm. Suitable radiation sources include mercury, mercury/xenon, and xenon lamps, x-ray or e-beam. The radiation is absorbed by the radiation-sensitive acid generator to produce free acid in the exposed area. The free acid catalyzes the cleavage of the acid labile pendant group of the copolymer which converts the copolymer from dissolution inhibitor to dissolution enhancer thereby increasing the solubility of the exposed resist composition in an aqueous base. Surprisingly, the exposed resist composition is readily soluble in aqueous base. This solubility is surprising and unexpected in light of the complex nature of the cycloaliphatic backbone and the high molecular weight of the norbornene monomer units bearing the carboxylic acid functionality. Preferably, after the film has been exposed to radiation, the film is again heated to an elevated temperature of about 90° C. to 150° C. for a short period of time of about 1 minute.

The third step involves development of the positive tone image with a suitable solvent. Suitable solvents include aqueous base preferably an aqueous base without metal ions such as tetramethyl ammonium hydroxide or choline. The composition of the present invention provides positive images with high contrast and straight walls. Uniquely, the dissolution property of the composition of the present invention can be varied by simply varying the composition of the copolymer.

The present invention also relates to an integrated circuit assembly such as an integrated circuit chip, multichip module, or circuit board made by the process of the present invention. The integrated circuit assembly comprises a circuit formed on a substrate by the steps of: (a) coating a substrate with a film comprising the positive tone resist composition of the present invention; (b) imagewise exposing the film to radiation; (c) developing the image to expose the substrate; and (d) forming the circuit in the developed film on the substrate by art known techniques.

After the substrate has been exposed, circuit patterns can be formed in the exposed areas by coating the substrate with a conductive material such as conductive metals by art known techniques such as evaporation, sputtering, plating, chemical vapor deposition, or laser induced deposition. The surface of the film can be milled to remove any excess conductive material. Dielectric materials may also be deposited by similar means during the process of making circuits. Inorganic ions such as boron, phosphorous, or arsenic can be implanted in the substrate in the process for making p or n doped circuit transistors. Other means for forming circuits are well known to those skilled in the art.

The following examples are detailed descriptions of methods of preparation and use of certain compositions of the present invention. The detailed preparations fall within the scope of, and serve to exemplify, the more generally described methods of preparation set forth above. The examples are presented for illustrative purposes only, and are not intended as a restriction on the scope of the invention.

As discussed above, photoresists are used to create and replicate a pattern from a photomask to a substrate. The efficacy of this transfer is determined by the wave length of the imaging radiation, the sensitivity of the photoresist and the ability of the photoresist to withstand the etch conditions which pattern the substrate in the exposed regions. Photoresists are most often used in a consumable fashion, where the photoresist is etched in the non-exposed regions (for a positive tone photoresist) and the substrate is etched in the exposed regions. Because the photoresist is organic and the substrate is typically inorganic, the photoresist has an inherently higher etch rate in the reactive ion etch (RIE) process, which necessitates that the photoresist needs to be thicker than the substrate material. The lower the etch rate of the photoresist matter, the thinner the photoresist layer has to be. Consequently, higher resolution can be obtained. Therefore, the lower the RME rate of the photoresist, the more attractive it is from a process point of view. The etch rate is primarily determined by the polymer backbone, as shown below for the chlorine plasma etch process which is a RIE technique typically employed in semiconductor processing.

As used in the examples and throughout the specification the ratio of monomer to catalyst is based on a mole to mole basis.

| No. | Polymer | Normalized RIE Rate ($\mu$m/min) |
|---|---|---|
| 1 | Novolac resist | 1.0 |
| 2 | polyhydroxystyrene resist | 0.98 |
| 3 | 248 nm (Deep UV) (acrylate terpolymer/novolac blend, U.S. Pat. No. 5,372,912) | 1.14 |
| 4 | 193 nm (polyacrylate terpolymer, Allen et al., Proceedings SPIE, 2438 (1), 474 (1995)) | 1.96 |
| 5 | homopolynorbornene | 0.83 |

Polymers 1 and 2 are primarily aromatic, whereas polymer 3 was copolymerized with a small amount of acrylate which increased its etch rate. Polymer 4 is completely based on acrylates to allow transparency at 193 nm (aromatic rings render the material opaque in this region, hence there are no viable resist candidates at 193 nm based on the traditional novolacs or p-hydroxystyrene). The etch rate almost doubled for this polymer. Polymer 5 had an etch rate even lower than the standard photoresist materials (1 & 2) in addition to providing transparency at 193 nm. Therefore, the backbone of polymer 5 (an addition cyclic olefin) prepared by a nickel multicomponent catalyst of this invention is an improvement over all previous attempts in the literature to provide a resist which functions at 193 nm with RIE characteristics comparable to commercial materials exposed at longer wave lengths. In fact, the addition cyclic olefin polymer may offer advantages in terms of etch resistance at longer wave lengths as well. It is in the literature (H. Gokan, S. Esho, and Y. Ohnishi, *J. Electrochem. Soc.* 130(1), 143 (1983)) that higher C/H ratios decreases the etch rate of polymeric materials. Based on this assumption, the etch rate of polymer 5 should be between the aromatic based systems and the acrylate systems. It is surprising that, the addition cyclic olefin exhibits etch resistance superior to even the aromatic systems.

EXAMPLE 1

To a 50 ml glass vial equipped with a Teflon® coated stir bar was added the t-butylester of 5-norbornene-carboxylic acid (carbo-t-butoxynorbornene) (2.0 g, 10.3 mmol, exo, endo 44/56). To this stirred monomer at ambient temperature was added a catalyst solution prepared by adding $\eta^3$-allylpalladium chloride dimer (38 mg, 103 $\mu$mol) in chlorobenzene (5 ml) to silver hexafluoroantimonate (99 mg, 290 $\mu$mol) in chlorobenzene (5 ml) for 30 minutes and then filtering through a micropore filter (to remove the precipitated silver chloride). The reaction was allowed to run for 36 hours at which time the mixture had gelled to form a clear yellow gel. Upon adding the gel to excess methanol the polymer precipitated as a white powder. The polymer was washed with excess methanol and dried. The yield of polymer was 1.5 g (75%). The presence of the ester-bearing monomer in the polymer was verified by infra-red analysis which showed strong bands at 1728 cm$^{-1}$ (C=O stretch), 1251 cm$^{-1}$ (C—O—C stretch) and 1369 and 1392 cm$^{-1}$ (characteristic of t-butyl groups) and the absence of unconverted monomer (proton NMR). The polymer was found to have a molecular weight ($M_w$) of 22,500. Thermogravimetric analysis (TGA) under nitrogen (heating rate 10° C. per minute) showed the polymer to be thermally stable to about 210° C. and then to exhibit approximately 28% weight loss by 260° C. (indicating clean loss of the t-butyl groups as isobutene to afford the homopolymer of 5-norbornene-carboxylic acid) and then degradation of the polymer (90% total weight loss) at around 400° C.

EXAMPLE 2

To a 50 ml glass vial equipped with a Teflon® coated stir bar was added norbornene (0.8 g, 8.6 mmol), 1,2-dichloroethane (8 ml) and the t-butylester of 5-norbornene-carboxylic acid (carbo-t-butoxynorbornene) (0.2 g, 1 mmol, exo,endo 44/56). To this stirred solution at ambient temperature was added nickel ethylhexanoate (3 $\mu$mol), trisperfluorophenylboron (23 $\mu$mol) and triethylaluminum (27 $\mu$mol). There ensued an immediate reaction with white polymer precipitating from solution within less than 10 seconds. The reaction was allowed to run for 60 minutes before the reactor contents were dissolved in cyclohexane and poured into an excess of methanol. The polymer was washed with excess methanol and dried overnight in a vacuum oven at 80° C. The yield of copolymer was 0.9 g (90%). The molecular weight of the copolymer was determined using GPC methods and found to be 535,000 ($M_w$) with a polydispersity of 4.7.

EXAMPLE 3

To a 50 ml glass vial equipped with a Teflon® coated stir bar was added the t-butylester of 5-norbornene-carboxylic acid (carbo-t-butoxynorbornene) (2.2 g, 11.3 mmol, exo, endo 44/56). To this stirred monomer at ambient temperature was added a catalyst solution prepared by adding $\eta^3$-allylpalladium chloride dimer (29 mg, 74 $\mu$mol) in dichloroethane (6 ml) to silver tetrafluoroborate (61 mg, 311 $\mu$mol) in dichloroethane (6 ml) for 30 minutes and then filtering through a micropore filter (to remove the precipitated silver chloride). The reaction was allowed to run for 36 hours at which time the mixture had gelled to form a clear yellow gel. Upon adding the gel to excess methanol the polymer precipitated as a white powder. The polymer was washed with excess methanol and dried. The yield of polymer was 1.4 g (64%). The presence of the ester-bearing monomer in the polymer was verified by infra-red analysis which showed strong bands at 1728 cm$^{-1}$ (C=O stretch), 1251 cm$^{-1}$ (C—O—C stretch) and 1369 and 1392 cm$^{-1}$ (characteristic of t-butyl groups) and the absence of unconverted monomer or carboxylic acid functionality (proton NMR and IR). The polymer was found to have a molecular weight ($M_w$) of 54,100. Thermogravimetric analysis (TGA) under nitrogen (heating rate 10° C. per minute) showed the polymer to be thermally stable to about 210° C. and then to exhibit approximately 29% weight loss by 250° C. (indicating clean loss of the t-butyl groups as isobutene to afford the homopolymer of 5-norbornene-carboxylic acid) and then degradation of the polymer (80% total weight loss) at around 400° C.

EXAMPLE 4

To a 100 ml glass vial equipped with a Teflon® coated stir bar was added norbomene (1.16 g, 12.3 mmol), 1,2-dichloroethane (50 ml) and the t-butylester of 5-norbornene-carboxylic acid (carbo-t-butoxynorbornene) (0.6 g, 3.1 mmol, exo,endo 44/56). To this stirred solution at ambient temperature was added palladium bis(2,2,6,6-tetramethyl-3,5-pentanedionate (31 $\mu$mol) and trisperfluorophenylboron (279 $\mu$mol). The reaction was allowed to run for 16 hours before the reactor contents were poured into an excess of methanol. The polymer was washed with excess methanol and dried overnight in a vacuum oven at 80° C. The yield of copolymer was 0.54 g (31%).

EXAMPLE 5

To a 50 ml glass vial equipped with a Teflon® coated stir bar was added the t-butylester of 5-norbornene-carboxylic acid (carbo-t-butoxynorbornene) (4.4 g, 22.7 mmol, exo, endo 44/56). To this stirred monomer at ambient temperature was added a catalyst solution prepared by adding $\eta^3$-allylpalladium chloride dimer (41.5 mg, 113 $\mu$mol) in dichloroethane (7 ml) to silver tetrafluoroborate (42 mg, 215 $\mu$mol) in dichloroethane (7 ml) for 30 minutes and then filtering through a micropore filter (to remove the precipitated silver chloride). The reaction mixture was then warmed in an oil bath to 75° C. After 90 minutes it was observed that the mixture had solidified to a grey polymeric mass. The mass was dissolved in acetone to afford a dark colored solution. Gaseous carbon monoxide was bubbled through the solution for 30 minutes resulting in copious amounts of a finely divided black precipitate (metallic palladium and possibly other catalyst residues). The precipitate was removed via centrifugation, and this process was repeated two more times. Fin ally the resulting colorless solution was filtered through a 45 micron microdisc and the polymer was precipitated by adding the acetone solution to an excess of hexane. The white polymer was separated using a centrifuge and then dried overnight to afford the copolymer as a white powder (2.21 g, 50%). Thermogravimetric analysis (TGA) under nitrogen (heating rate 10° C. per minute) showed the polymer to be thermally stable to about 210° C. and then to exhibit approximately 28% weight loss by 260° C. (indicating clean loss of the t-butyl groups as isobutene to afford the homopolymer of 5-norbornene-carboxylic acid) and then degradation of the polymer (90% total weight loss) at around 400° C. The molecular weight was observed to be Mn=3,300 g/mole and Mw=6,900 g/mole (GPC in TBF, polystyrene standards).

EXAMPLE 6

To a 50 ml glass vial equipped with a Teflon® coated stir bar was added the pure exo isomer of the t-butylester of 5-norbornene-carboxylic acid (carbo-t-butoxynorbornene) (0.6 g). To this stirred monomerat ambient temperature was added a catalyst solution prepared by adding $\eta^3$-allyi-palladium chloride dimer (30 mg) in dichloroethane (10 ml) to silver hexafluoroantimonate (50 mg) in dichloroethane (20 ml) for 30 minutes and then filtering through a micropore filter (to remove the precipitated silver chloride). The reaction was allowed to run for 15 hours at which time the mixture was added to excess methanol causing the polymer to precipitate as a white powder. The polymer was washed with excess methanol and dried. The yield of polymer was 0.5 g (85%). The polymer was found to have a molecular weight ($M_w$) of 46,900, and a polydispersity of 2.4.

EXAMPLE 7

To a 100 ml glass vial equipped with a Teflon® coated stir bar was added norbornene (4.01 g, 42.6 mmol), 1,2-dichloroethane (50 ml) and the t-butylester of 5-norbornene-carboxylic acid (carbo-t-butoxynorbornene) (2 g, 10.3 mmol, exo,endo mixture). To this stirred solution at ambient temperature was added a catalyst solution prepared by reacting $\eta^3$-allylpalladium chloride dimer (10 mg, 27.3 $\mu$mol) with silver hexafluoroantimonate (19.6 mg, 57 $\mu$mol) in 1,2-dichloroethane (3 ml) for 30 minutes and then filtering through a micropore filter. The reaction was allowed to run for 20 hours before the reactor contents were poured into an excess of methanol. The polymer was washed with excess methanol and dried. The yield of copolymer was 4.15 g. The molecular weight of the copolymer was determined using GPC methods and found to be 618,000 ($M_w$) with a polydispersity of 7.1.

EXAMPLE 8

To a 100 ml glass vial equipped with a Teflon® coated stir bar was added norbornene (3.75 g, 39.8 mmol), 1,2-dichloroethane (50 ml) and the t-butylester of 5-norbornene-carboxylic acid (carbo-t-butoxynorbornene) (2 g, 10.3 mmol, exo,endo mixture). To this stirred solution at ambient temperature was added palladium ethylhexanoate (12 $\mu$mol, tris(perfluorophenylboron (108 $\mu$mol) and triethylaluminum (120 $\mu$mol). The reaction was allowed to run for 72 hours before the reactor contents were poured into an excess of methanol. The polymer was washed with excess methanol and dried, redissolved in chlorobenzene and reprecipitated with an excess of methanol, filtered, and washed with methanol before finally drying in a vacuum oven overnight at 80° C. The yield of copolymer was 1.66 g. The molecular weight of the copolymer was determined using GPC methods and found to be 194,000 ($M_w$) with a polydispersity of 2.3. The presence of the ester-bearing monomer in the copolymer was verified by infra-red analysis which showed bands at 1730 cm$^{-1}$ (C=O stretch) and 1154 cm$^{-1}$ (C—O—C stretch) and the absenceof unconverted monomer (proton NMR).

EXAMPLE 9

To a 100 ml glass vial equipped with a Teflon® coated stir bar was added 1,2-dichloroethane (25 ml) and the t-butylester of 5-norbornene-carboxylic acid (carbo-t-butoxynorbornene) (10 g, 51.5 mmol, exo,endo mixture). To this stirred solution at ambient temperature was added a catalyst solution prepared by reacting $\Theta^3$-allylpalladium chloride dimer (82 mg, 223 $\mu$mol) with silver hexafluoroantimonate (200 mg, 581 $\mu$mol) in 1,2-dichloroethane (10 ml) for 30 minutes and then filtering through a micropore filter. The reaction was allowed to run for 48 hours before the reactor contents were poured into an excess of methanol. The polymer was washed with excess methanol and dried. The yield of homopolymer was 4.5 g.

EXAMPLE 10

To a 100 ml glass vial equipped with a Teflon® coated stir bar was added 1,2-dichloroethane (50 ml), the t-butylester of 5-norbornene-carboxylic acid (carbo-t-butoxynorbornene) (5 g, 25.8 mmol, exo,endo mixture), norbornene (0.82 g, 8.7 mmol) and 5-triethoxysilylnorbornene (0.47 g, 1.8 mmol). To this stirred solution at ambient temperature was added a catalyst solution prepared by reacting $\eta^3$-allylpalladium chloride dimer (47.2 mg, 128 lmol) with silver tetrafluoroborate (138 mg, 700 $\mu$mol) in 1,2-dichloroethane (10 ml) for 30 minutes and then filtering through a micropore filter. The reaction was allowed to run for 48 hours before the reactor contents were poured into an excess of methanol. The polymer was washed with excess methanol and dried. The yield of terpolymer was 5.3 g. The molecular weight of the copolymer was determined using GPC methods and found to be 39,900 ($M_w$) with a polydispersity of 3.2.

EXAMPLE 11

To a 50 ml glass vial equipped with a Teflon® coated stir bar was added 7.25 g (37.5 mmole) of the t-butylester of norbornene, 1.9 g (12.5 mmole) of methylester of norbornene, 50 ml of freshly distilled dichloroethane and the solution was degassed under argon atmosphere. A 10 ml glass vial equipped with a Teflon® coated stir bar was charged with 0.0365 g (0.1 mmol) of $\eta^3$-allylpalladium chloride dimer (to ultimately give a monomer to catalyst ratio of 500/1) and 2 ml of dichloroethane. Into another 10 ml glass vial was charged with 0.0344 g (0.1 mmol) of silver hexafluoroantimonate and 2 ml of dichloroethane. The catalyst solution was prepared by mixing the allylpalladium chloride dimer solution with silver hexafluoroantimonate solution inside the dry box. Immediate precipitation of the silver chloride salt was observed, which was filtered, to obtain a clear yellow solution. The active yellow catalyst solution was added to the monomer solution via a syringe and the reaction mixture was allowed to stir for 20 hours at 60° C. No appreciable increase in viscosity was observed, but solids had precipitated in the solution, the solution was cooled, concentrated in a rotovap, and precipitated into hexane to obtain a white polymer. Yield=2.3 g, 26%. The polymer was dried in vacuum at room temperature and analyzed using GPC for molecular weight. GPC was obtained in THF using polystyrene standards. The molecular weight was observed to be $M_n$=1950 gimole and $M_w$=3150 g/mole. $^1$H NMR indicated the presence of both methyl and t-butyl ester of norbornene and also a small amount of the t-butyl hydrolyzed product, the acid.

EXAMPLE 12

To a 50 ml glass vial equipped with a Teflon® coated stir bar was added 2.42 g (12.5 mmole) of t-butylester of norbornene, 5.7 g (37.5 mmole) of methylester of norbornene, 50 ml of freshly distilled dichloroethane, and the solution was degassed under argon atmosphere. A 10 ml glass vial equipped with a Teflon® coated stir bar was charged with 0.0365 g (0.1 mmol) of allylpalladium chloride dimer in a monomer to catalyst ratio of 500/1 and 2 ml of dichloroethane. Into another 10 ml glass vial was charged with 0.0344 g (0.1 mmol) of silver hexafluoro antimunate and 2 ml of dichloroethane. The catalyst solution was prepared by mixing the allylpalladium chloride dimer solution with silver hexafluoroantimonate solution inside the dry box. Immediate precipitation of the silver chloride salt was observed, which was filtered, to obtain a clear yellow solution. The active yellow catalyst solution was added to the monomer solution via a syringe and the reaction mixture was allowed to stir for 20 hours at 60° C. No appreciable increase in viscosity was observed, but solids had ppt in the solution, the solution was cooled, concentrated in a rotovap, and precipitated into hexane to obtain a white polymer. Yield=2.05 g, 25%. The polymer was dried in vacuum at room temperature and analyzed using GPC for molecular weight. GPC was obtained in TBF using Polystyrene standards. The molecular weight was observed to be $M_n$=1440 g/mole and $M_w$=2000 g/mole. $^1$H NMR indicated the presence of both methyl and t-butyl ester of norbornene and also a small amount of the t-butyl hydrolyzed product, the acid.

EXAMPLE 13

To a 25 ml glass vial equipped with a Teflon® coated stir bar was added 2 g (7.94 mmole) of pure of bicyclo[2.2.1]hept-5-enexo,-2-t-butyl, exo-3-methyl ester of dicarboxylic acid followed by 15 ml of freshly distilled methylene chloride and 10 ml of methanol; and the solution was degassed under argon atmosphere. A 10 ml glass vial equipped with a Teflon® coated stir bar was charged with 0.00588 g (0.0158 mmol) of $\eta^3$-allylpalladium chloride dimer in a monomer to catalyst ratio of 500/1 and 2 ml of methylene chloride. Into another 10 ml glass vial was charged with 0.0108 g (0.0312 mmol) of silver hexafluoroantimonate and 2 ml of methylene chloride. The catalyst solution was prepared by mixing the $\eta^3$-allylpalladium chloride dimer solution with silver hexafluoroantimonate solution inside the dry box. Immediate precipitation of the silver chloride salt was observed, which was filtered, to obtain a clear yellow solution. The active yellow catalyst solution was added to the monomer solution via a syringe at 50° C. and the reaction mixture was allowed to stir for 16 hours at room temperature. No appreciable increase in viscosity was observed and the solution was filtered through a 0.5$\mu$ filter, concentrated using a rotovap. The thick solution was dissolved in methanol and ppt into methanol/water mixture to obtain a white solid yield (65%). The molecular weight was observed to be Mn=10,250 g/mole and Mw=19,700 g/mole (GPC in the THF, polystyrene standards). $^1$H NMR indicates the presence of both methyl and t-butyl ester of norbornene.

EXAMPLE 14

To a 25 ml glass vial equipped with a Teflon® coated stir bar was added 3.06 g (12.8 mmole) of pure of bicyclo[2.2.1]hept-5-ene-exo,exo-2,3-dicarboxylic acid diethyl ester, 2.5 g (12.8 mmole) of t-butylester of norbornene, followed by 15 ml of freshly distilled methylene chloride and 10 ml of methanol, and the solution was degassed under argon atmosphere. A 10 ml glass vial equipped with a Teflon® coated stir bar was charged with 0.0188 g (0.052 mmol) of allylpalladium chloride dimer (to give a monomer to catalyst ratio of 500/1) and 2 ml of methylene chloride. Into another 10 ml glass vial was charged with 0.0357 g (0.104 mmol) of silver hexafluoroantimonate and 2 ml of methylene chloride. The catalyst solution was prepared by mixing the allylpalladium chloride dimer solution with silver hexafluoroantimonate solution inside the dry box. Immediate precipitation of the silver chloride salt was observed, which was filtered, to obtain a clear yellow solution. The active yellow catalyst solution was added to the monomer solution via a syringe at 50° C. and the reaction mixture was allowed to stir for 16 hours at room temperature. No appreciable increase in viscosity was observed and the solution was filtered through a 0.5$\mu$ filter, concentrated using a rotovap. The resulting viscous solution was dissolved in methanol and precipitated into methanol/water mixture to obtain a white solid yield (23%). The molecular weight was observed to be Mn=15,700 g/mole and Mw=32,100 g/mole (GPC in TlF, polystyrene standards). $^1$H NMR indicates the presence of both methyl and t-butyl ester of norbornene. Thermogravimetric analysis (TGA) under nitrogen (heating rate 10° C./min.) showed the polymer to be thermally stable to about 155° C. and then to exhibit approximately 20 wt. % loss by 290° C. (indicating clean loss of the t-butyl groups as isobutylene to afford the homopolymer of 5-norbornene-carboxylic acid) and then degradation of the polymer at around 450° C.

EXAMPLE 15

Synthesis of bicyclo[2.2.1]hept-5-ene-exo, exo-2,3-dicarboxylic acid diethyl ester:

The exo, exo diethyl ester of norbornene was synthesized from exo-5-norbornene-2,3-dicarboxyhc acid. The exo isomer was prepared by thermal conversion of the endo-5-norbornene-2,3-dicarboxylic anhydride at 190° C. followed by recrystallization from toluene several times as in reference 1 to obtain pure exo-5-norbornene-2,3-dicarboxylic anhydride. Part of the exo-anhydride was hydrolyzed in boiling water and the solution was cooled to obtain pure diacid in almost quantitative yield. The diacid was converted to the diethyl ester using triethyloxonium salts as shown below:

A 250 ml, three necked, round bottomed flask with a magnetic stirring bar was charged with 16.0 g (0.0824 mole) of pure exo norbornene dicarboxylic acid and 35 g (0.1846 mole) of triethyloxonium tetrafluoroborate. The flask was stoppered, and to this 300 ml of dichloromethane was added via a cannula under argon atmosphere. The rubber stopper was replaced with a condenser under argon atmosphere and the other neck was fitted with an additional funnel. To the additional funnel was added 35 ml of ethyldiisopropyl amine and it was allowed to drip into the reaction vessel slowly. A small exotherm was observed and the solution was allowed to reflux lightly. After the complete addition of the amine, the solution was allowed to stand at room temperature for 15 hours. Work-up is initiated by extracting the reaction mixture with three 50 ml portions of HCl solution, followed by three 50 ml extractions with sodium bicarbonate and finally washed two times with water. The organic solution was dried over magnesium sulfate, treated with carbon black, filtered, concentrated on a rotary evaporator. Purification of the residue by distillation at 110° C. provides 15 g (75%) of pure exo-diethyl ester of norbornene as a colorless, viscous, fruity smelling liquid. $^1$H NMR (CDCl$_3$): d=1.22 (3H; t, CH$_3$), d=1.47 (1H), d=2.15 (1H), d=2.58 (2H; s, C$\underline{H}$COO), d=3.07

(2H; s, bridge head), d=4.10 (2H; m, CH$_2$), d=6.19 (2H; s, C=C), FI-MS (DIP)=M+ (238).

EXAMPLE 16

Synthesis of bicyclo[2.2.1]hept-5-ene-exo-2-t-butyl ester, exo-3-carboxylic acid:

To a 50 ml single necked round bottom flask equipped with a Teflon® coated stir bar was added 1.5 g (9.15 mmole) of pure exo-Nadicanhydride, 10 ml of freshly distilled methylenechloride, 20 mL of t-butanol (0.209 moles). To the solution was added 7.5 g (0.061 moles) of dimethylamino pyridine and the solution was refluxed at 75° C. for 8 hours. Initially the anhydride was not soluble, but over the period of time the solids had dissolved and the solution had turned brown. The reaction was cooled, concentrated in a rotovap to remove methylene chloride and the thick solution was added slowly into acidified water (HCl). The solid that precipitated out was filtered, washed with water and further dissolved in ether treated with MgSO$_4$, followed by carbon black and the solution was filtered over Celite. The ether was removed over a rotovap to obtain a white solid (yield 8.5g60%).

$^1$H NMR (CDCl$_3$): d=1.47 (9H; s, t-butyl), d=1.60 (1H), d=2.15 (1H), d=2.58 (2H; m, CHCOO), d=3.07 (2H; s, bridge head), d=6.19 (2H; s, C=C), d=10.31 (1H; broad, COOH).

EXAMPLE 17

Synthesis of bicyclo[2.2.1]hept-5-ene-exo-2-t-butyl,exo-3-methyl ester of dicarboxylic acid:

A 100 ml, three necked, round bottomed flask with a magnetic stirring bar was charged with 9.7 g (0.0408 mole) of pure exo t-butyl half ester of norbornene dicarboxylic acid and 6.05 g (0.0408 mole) of trimethyloxonium tetrafluoroborate. The flask was stoppered, and to this 100 ml of dichloromethane was added via a cannula under argon atmosphere. The rubber stopper was replaced with a condenser under argon atmosphere and the other neck was fitted with an additional fuinnel. To the additional funnel was added 7.3 ml of ethyldiisopropyl amine and it was allowed to drip into the reaction vessel slowly. Small exotherm was observed and the solution was observed to reflux lightly. After the complete addition of the amine, the solution was allowed to stand at room temperature for 15 hours. Work-up is initiated by extracting the reaction mixture with three 50 ml portion of HCl solution, followed by three 50 ml extractions with sodium bicarbonate and finally washed two times with water. The organic solution was dried over magnesium sulfate, treated with carbon black, filtered, concentrated on a rotary evaporator. A colorless liquid was obtained which started to crystallize. The solid was washed with cold pentane and the pentane solution was concentrated in a rotovap to obtain a colorless liquid which on cooling crystallized. Yield 5.1 g.

$^1$H NMR (CDCl$_3$): d=1.45 (9H; s, t-butyl), d=1.47 (1H), d=2.15 (1H), d=2.54 (2H; m, CHCOO), d=3.07 (2H; s, bridge head), d=3.65 (3H; s, CH$_3$), d=6.19 (2H; s, C=C).

EXAMPLE 18

To a 50 ml glass vial equipped with a Teflon® coated stir bar was added 5-norbornene-carboxylic acid (2.0 g, 14.5 mmol, exo,endo mixture) and dichloroethane (20 ml). To this stirred mixture at ambient temperature was added a catalyst solution prepared by adding η$^3$-allylpalladium chloride dimer (6 mg, 16 μmol) in dichloroethane (5 ml) to silver hexafluoroantimonate (50 mg, 146 μmol) in dichloroethane (5 ml) for 30 minutes and then filtering through a micropore filter (to remove the precipitated silver chloride). The reaction was allowed to run for 18 hours at which time the mixture had gelled to form a clear yellow gel. Upon adding the gel to excess hexane the polymer precipitated as a white powder. The polymer was washed with excess hexane and dried. The yield of polymer was 1.2 g (60%). The polymer was found to have a molecular weight (M$_w$) of 22,000 and a polydispersity of 2.3.

Upon adding a portion of this polymer (0.5 g) to an 0.1N stirred aqueous solution of KOH (10 ml) the polymer immediately dissolved to give a non-viscous, colorless solution. This demonstrates the base developability of these materials since none of the homopolymers of the t-butylester of 5-norbornene-carboxylic acid showed any tendency to dissolve under the same conditions.

EXAMPLE 19

The Pinner synthesis of ortho esters is a two-step synthesis:

Step 1. Synthesis of Imidic Ester Hydrochloride.

The reaction was carried out in a 1 L two-neck round-bottom flask equipped with a stirrer, an oil bubbler, and a tube with anhydrous calcium chloride. The following reagents were placed in the flask: 100 g (0.84 mol) norbornene carbonitrile (NB—CN), 37 ml (0.91 mol) anhydrous methanol, and 200 mL anhydrous diethyl ether. The flask was placed into the ice-water bath and 61 g (1.67 mol) dry hydrogen chloride was bubbled through the mixture with stirring during 1.5 hours. The flask was placed overnight in a refrigerator at 0° C. In the morning, the mixture solidified into a "cake". It was broken into pieces and additional 200 ml of diethyl ether were added. The flask was kept in refrigerator for another 10 days with occasional stirring. At the end of this period, precipitated imidic ester hydrochloride was filtered by suction and washed 5 times with ~300 mL diethyl ether. Ca. 20 g of unreacted NB—CN were recovered from filtrate.

Yield of imidic ester hydrochloride—76% (120 g, 0.64 mol). Structure of the product was confirmed by $^1$H NMR spectroscopy.

Step 2. Synthesis of Ortho Ester.

In a 0.5 L flask, 56.7 g (0.30 mol) imidic ester hydrochloride, 37 ml (0.91 mol) anhydrous methanol, and 250 ml anhydrous petroleum ether were placed. The reaction mixer was kept at room temperature for 5 days with occasional stirring. Precipitated ammonium chloride was filtered off and washed with petroleum ether three times. Filtrate and washes were combined, petroleum ether was distilled off, and product was fractionally distilled in vacuum. A fraction with the boiling point 68–69° C./3 mm Hg was collected. Yield—50% (30 g, 0.15 mol). According to $^1$H NMR spectrum, the product is 97+% 5-norbornene-2-trimethoxymethane (ortho ester).

EXAMPLE 20

To a solution of 2.16 g (10.9 mmol) C$_7$H$_9$C(OCH$_3$)$_3$ (norbornene trimethylorthoester) in 16 ml 1,2-dichloroethane, was added a solution of the reaction product of mixing 1 mole of allylpalladium chloride dimer with 2 moles of silver hexafluoroantimonate in dichloroethane and filtering off the resulting silver chloride precipitate. The amount of catalyst added corresponded to 0.08 mmol of palladium dissolved in 2 ml dichloroethand. The stirred reaction mixture was placed in an oil-bath at 70° C. and allowed to react for 20 hours.

At the end of the reaction, 2 ml methanol was added, solvents removed on a rotary evaporator, and polymer dried to a constant weight in vacuum.

Yield—1.28 g (60%).

EXAMPLE 21

To a 50 ml glass vial equipped with a Teflon® coated stir bar was added bicyclo[2.2.1]hept-5-ene-2-methyl acetate (18.44 g, 0.1109 mol) and t-butylester of norbornene (21.55 g, 0.1109 mol) and 75 ml of toluene. A solution of the nickel catalyst [toluene complex of bisperfluorophenyl nickel, $(Tol)Ni(C_6F_5)_2$] was prepared in the dry box by dissolving 0.5367 g (1.109 mmol of $(Tol)Ni(C_6F_5)_2$] in 15 ml of toluene. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone, and dried overnight under vacuum. The isolated yield of polymer was 24.9 g (63%). The polymer was characterized using GPC for molecular weight. Mn=21,000 and Mw=52,000. The NMR analysis of the copolymer indicated presence of 51 mole % of the t-butyl groups. IR analysis of the copolymer indicated the absence of acid groups.

EXAMPLE 22

To a 50 ml glass vial equipped with a Teflon® coated stir bar was added bicyclo[2.2.1]hept-5-ene-2-methyl ethyl-carbdnate (4.03 g, 0.0205 mol) and t-butylester of norbornene (3.98 g, 0.0205 mol) and 50 ml of toluene. A solution of the nickel catalyst [toluene complex of bisperfluorophenyl nickel, $(Tol)Ni(C_6F_5)_2$] was prepared in the dry box by dissolving 0.0991 g (0.2049 mmol of $(Tol)Ni(C_6F_5)_2$] in 15 ml of toluene. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone and dried overnight under vacuum. The isolated yield of polymer was 4.16 g (52%). The polymer was characterized using GPC for molecular weight. Mn=22,000 and Mw=58,000. The NMR analysis of the copolymer indicated presence of 50 mole % of the t-butyl groups. IR analysis of the copolymer indicated the absence of acid groups.

EXAMPLE 23

To a 50 ml glass vial equipped with a Teflon® coated stir bar was added bicyclo[2.2.1]hept-5-ene-2-methyl butylcarbonate (17.15 g, 0.0764 mol) and t-butylester of norbornene (14.85 g, 0.0764 mol) and 72 ml of toluene. A solution of the nickel catalyst toluene complex of bisperfluorophenyl nickel, $(Tol)Ni(C_6F_5)_2$] was prepared in the dry box by dissolving 0.3699 g (0.7644 mmol of $(Tol)Ni(C_6F_5)_2$] in 15 ml of toluene. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone, and dried overnight under vacuum. The isolated yield of polymer was 17.53 (54%). The polymer was characterized using GPC for molecular weight. Mn=22,000 and Mw=58,000. The NMR analysis of the copolymer indicated presence of 54 mole % of the t-butyl groups. IR analysis of the copolymer indicated the absence of acid groups.

EXAMPLE 24

To a 50 ml glass vial equipped with a Teflon® coated stir bar was added t-butyl ester of norbornene (29.92 g, 0.154 mol), followed by dried maleic anhydride (15.10 g, 0.154 mol) and 90 ml of chlorobenzene. This mixture was degassed three times to remove any trace oxygen. The reaction mixture was then heated to 80° C. A degassed benzoyl peroxide solution consisting of 0.9948 g (0.04 mol) benzoyl peroxide free radical initiator in 10 ml of chlorobenzene was added to the reaction mixture with a dry syringe. The reaction was left to stir for 19 hours. After the reaction, the polymer solution was poured directly into hexane to precipitate the polymer. A white precipitate was obtained. The precipitated polymer was then stripped out of any unreacted maleic anhydride that may have been present. The polymer was then dried overnight in a vacuum oven at room temperature. The weight of dry polymer obtained was 20.62 g, giving a 45.8% yield. The polymer was characterized using GPC for molecular weight. Mn=4,200 and Mw=8,800. The NMR analysis of the copolymer indicated presence of the t-butyl groups. IR analysis of the copolymer indicated the presence of both t-butyl and maleic anhydride groups.

EXAMPLE 25

To a 50 ml glass vial equipped with a Teflon® coated stir bar was added bicyclo[2.2.1]hept-5-ene-2-methyl acetate (13.3 g, 0.0799 mol), t-butyl ester of norbornene (15.70 g, 0.0808 mol), followed by dried maleic anhydride (15.85 g, 0.162 mol) and 90 ml of chlorobenzene. This mixture was degassed three times to remove any trace oxygen. The reaction mixture was then heated to 80° C. A degassed benzoyl peroxide solution consisting of 1.0438 g (0.041 mol) benzoyl peroxide free radical initiator in 10 ml of chlorobenzene was added to the reaction mixture with a dry syringe. The reaction was left to stir for 19 hours. After the reaction, the polymer solution was poured directly into hexane to precipitate the polymer. A white precipitate was obtained. The precipitated polymer was then stripped out of any unreacted maleic anhydride that may have been present. The polymer was then dried overnight in a vacuum oven at room temperature. The weight of dry polymer obtained was 21.89 g, giving a 48.7% yield. The polymer was characterized using GPC for molecular weight. Mn=3,000 and Mw=6600. The NMR analysis of the copolymer indicated presence of the acetate and t-butyl groups. IR analysis of the copolymer indicated presence of acetate, t-butyl and maleic anhydride groups.

EXAMPLE 26

(50:50 Copolymer of t-BuNBEster/NB—COOH)

To a 50 ml glass vial equipped with a magnetic stirring bar and under a nitrogen atmosphere was added the t-butyl ester of norbornene carboxylic acid (2 g, 10 mmol) and norbornene carboxylic acid (1.38 g, 10 mmol). To this stirred mixture was added, at ambient temperature, the initiator (t-butyl peroxide) (2.9 g) and the resulting mixture was heated to 130° C. and stirring was continued for 16 hours. The resulting polymer (soluble in both THF and toluene) was precipitated into hexane and filtered to afford the product, which on drying weighed 2.91 g (86% conversion). The resulting solid polymer exhibited an Mw of 20,000, Mn 3,000). IR, NMR and TGA analysis of the copolymers confirmed their composition to be random addition copolymers of the two monomers.

EXAMPLE 27
(50:50 Copolymer of t-BuNBEster/NB-MeNBEster)

To a 50 ml glass vial equipped with a magnetic stirring bar and under a nitrogen atmosphere was added the t-butyl ester of norbornene carboxylic acid (2 g, 10 mmol) and the methyl ester of norbornene carboxylic acid (1.5 g, 10 mmol). To this stirred mixture was added, at ambient temperature,the initiator (t-butyl peroxide) (2.9 g) and the resulting mixture was heated to 130° C. and stirring was continued for 16 hours. The resulting polymer (soluble toluene) was precipitated into methanol and filtered to afford the product, which on drying weighed 0.82 g (23% conversion). The resulting solid polymer exhibited an Mw of 35,000, Mn 6,000). IR, NMR and TGA analysis of the copolymers confirmed their composition to be random addition copolymers of the two monomers.

EXAMPLE 28
(50:50 Copolymer of t-BuNBEster/EtTDEster)

To a 100 ml glass vial equipped with a magnetic stirring bar and under a nitrogen atmosphere was added toluene (40 ml), t-butyl ester of norbornene carboxylic acid (1.94 g, 10 mmol) and ethyl ester of tetracyclododecene carboxylic acid (2.32 g, 10 mmol). To this stirred solution was added, at ambient temperature, a solution of bis (tricyclohexylphosphine)-benzylideneruthenium dichloride (34 mg, 0.042 mmol) in 5 ml of toluene. After 1 hour ethyl vinyl ether (0.015 ml, 0.156 mmol) was added and stirred 1 hour. The polymer solution was precipitated by addition to excess MeOH, collected by filtration and dried under vacuum. Recovered 3.46 g (81% yield) of copolymer was recovered (Mw 221,000, Mn 133,000).

The copolymer was redissolved in toluene and passed through a column of silica gel with a resulting noticeable color (Ru) removal. The polymer was again precipitated in excess MeOH rendering a pure white copolymer.

EXAMPLE 29
(50:50 Copolymer of t-BuNBEster/EtTDEster)

To a 100 ml glass vial equipped with a magnetic stirring bar and under a nitrogen atmosphere was added toluene (80 ml), t-butyl ester of norbornene carboxylic acid (3.9 g, 20 mmol) and ethyl ester of tetracyclododecene carboxylic acid (4.64 g, 20 mmol). To this stirred solution was added, at ambient temperature, a solution of bis (tricyclohexylphosphine)benzylideneruthenium dichloride (68 mg, 0.083 mmol) in 5 ml of toluene. After 2 hours ethyl vinyl ether (0.030 ml, 0.31 mmol) was added and stirred 2 hours.

The orange-amber solution was passed through silica gel column to obtain a clear colorless solution. The solution was precipitated by addition of excess MEOH, collected by filtration and dried under vacuum. 6.54 g (77% yield) of copolymer was recovered (Mw 244,000, Mn 182,000). The glass transition temperature was measured using DSC methods and determined to be 220° C.

EXAMPLE 30
(50:50 Copolymer of t-BuNBEster/EtTDEster)

To a 300 ml stainless steel reactor equipped with a mechanical stirrer and containing nitrogen was added toluene (90 ml), t-butyl ester of norbornene carboxylic acid (3.9 g, 20 mmol) and ethyl ester of tetracyclododecene carboxylic acid (4.64 g, 20 mmol). To this stirred solution was added, at ambient temperature, a solution of bis (tricyclohexylphosphine)benzylideneruthenium dichloride (68 mg, 0.083 mmol) in 5 ml of toluene. After 2 hours ethyl vinyl ether (0.030 ml, 0.31 mmol) was added and stirred 16 hours. Hydrogen (350 psig) was added to reactor and the temperature was maintained at 175° C. for 7 hours. Following reaction the solution was passed through a silica gel column and the hydrogenated copolymer was isolated. NMR methods were used to determine that the copolymer was 95% hydrogenated (Mw 237,000, Mn 163,000).

EXAMPLE 31
(50:50 Copolymer of t-BuNBEster/EtTDEster)

To a 300 ml stainless steel reactor equipped with a mechanical stirrer and containing nitrogen was added toluene (90 ml), t-butyl ester of norbornene carboxylic acid (2.9 g, 15 mmol) and ethyl ester of tetracyclododecene carboxylic acid (3.5 g, 15 mmol). To this stirred solution was added, at ambient temperature, a solution of bis (tricyclohexylphosphine)benzylideneruthenium dichloride (50 mg, 0.060 mmol) in 5 ml of toluene. After 2 hours hydrogen (800 psig) was added to reactor and temperature maintained at 175° C. for 7 hours. Following reaction the solution was passed through silica gel column and the hydrogenated coplymer was isolated. NMR methods were used to determine that the copolymer was 96% hydrogenated (Mw 278,000, Mn 172,000).

EXAMPLE 32
(50:50 Copolymer of t-BuNBEster/EtTDEster)

To a 100 ml glass vial equipped with a magnetic stirring bar and containing nitrogen was added toluene (40 ml), t-butyl ester of norbornene carboxylic acid (1.94 g, 10 mmol), ethyl ester of tetracyclododecene carboxylic acid (2.32 g, 10 mmol) and 1-hexene (0.050 ml, 0.4 mmol). To this stirred solution was added, at ambient temperature, a solution of bis(tricyclohexylphosphine) benzylideneruthenium dichloride (34 mg, 0.042 mmol) in 5 ml of toluene. After 2 hours the polymer solution was added to an excess of MeOH, collected by filtration and dried under vacuum. 3.1 g (73% yield) of polymer was recovered (Mw 35,000, Mn 22,000).

EXAMPLE 33
(50:50 Copolymer of t-BuNBEster/EtTDEster)

To a 100 ml glass vial equipped with a magnetic stirring bar and containing nitrogen was added toluene (40 ml), t-butyl ester of norbornene carboxylic acid (1.94 g, 10 mmol), ethyl ester of tetracyclododecene carboxylic acid (2.32 g, 10 mmol) and 1-hexene (0.275 ml, 2.2 mmol). To this stirred solution was added, at ambient temperature, a solution of bis(tricyclohexylphosphine)benzylideneruthenium dichloride (34 mg, 0.042 mmol) in 5 ml of toluene. After 2 hours the polymer solution was added to an excess of MeOH, collected by filtration and dried under vacuum. 3.45 g (81% yield) of polymer was recovered (Mw 8,000, Mn 6,000)

EXAMPLE 34
(50:50 Copolymer of t-BuNBEster/EtTDEster)

To a 100 ml glass vial equipped with a magnetic stirring bar and containing nitrogen was added toluene (40ml), 1-butyl ester of norbornene carboxylic acid (1.94 g, 10 mmol), ethyl ester of tetracyclododecene carboxylic acid (2.32 g, 10 mmol) and 1-hexene (0.62 ml, 5.0 mmol). To this stirred solution was added, at ambient temperature, a solution of bis(tricyclohexylphosphine)benzylideneruthenium dichloride (34 mg, 0.042 mmol) in 5 ml of toluene. After 2 hours the polymer solution was added to an excess of MEOH, collected by filtration and dried under vacuum. 2.75 g (65% yield) of polymer was recovered.

EXAMPLE 35
(50:50 Copolymer of t-BuNBEster/EtTDEster)

To a 100 ml glass vial equipped with a magnetic stirring bar and containing nitrogen was added toluene (80 ml), t-butyl ester of norbornene carboxylic acid (3.9 g, 20 mmol), ethyl ester of tetracyclododecene carboxylic acid (4.64 g, 20 mmol) and 1-hexene (0.088 ml, 0.7 mmol). To this stirred solution was added, at ambient temperature, a solution of bis(tricyclohexylphosphine)benzylideneruthenium dichloride (68 mg, 0.083 mmol) in 5 ml of toluene. After 2 hours ethyl vinyl ether (0.030 ml, 0.31 mmol) was added and stirred 2 hours.

The orange-amber polymer solution was passed through silica gel column which removed the dark color (Ru). The solution was precipitated by addition to excess MeOH, collected by filtration and dried overnight at 80° C. under vacuum. 2.6 g (30% yield) of polymer was recovered (Mw 4,000, Mn 3,000).

EXAMPLE 36
(50:50 Copolymer of t-BuNBEster/EtTDEster,)

To a 300 ml stainless steel reactor equipped with a mechanical stirrer and containing nitrogen was added toluene (80 ml), t-butyl ester of norbornene carboxylic acid (3.9 g, 20 mmol), ethyl ester of tetracyclododecene carboxylic acid (4.64 g, 20 mmol) and 1-hexene (0.088 ml, 0.7 mmol). To this stirred solution was added, at ambient temperature, a solution of bis(tricyclohexylphosphine)benzylideneruthenium dichloride (68 mg, 0.042 mmol) in 5 ml of toluene. After 2 hours hydrogen (750 psig) was added to reactor and temperature maintained at 175° C. for 20 hours.

The solution was precipitated by addition to excess methanol, collected by filtration and dried overnight at 80° C. under vacuum. Approximately 5 g (59% yield) of polymer was recovered (Mw 30,000, Mn 20,000). NMR methods were used to determine that the copolymer was greater than 99% hydrogenated.

EXAMPLE 37
(65:35 Copolymer of t-BuNBEster/EtTDEster)

To a 250 ml round bottomed flask equipped with a magnetic stirring bar and containing nitrogen was added toluene (160 ml), t-butyl ester of norbornene carboxylic acid (10.1 g, 52 mmol), ethyl ester of tetracyclododecene carboxylic acid (6.5 g, 28 mmol) and 1-hexene (0.176 ml, 1.4 mmol). To this stirred solution was added, at ambient temperature, a solution of bis(tricyclohexylphosphine)benzylideneruthenium dichloride (131 mg, 0.160 mmol) in 5 ml of toluene. After 16 hours ethyl vinyl ether (0.060 ml, 0.62 mmol) was added and stirred 1.5 hours. The polymer solution was passed through silica gel column to remove Ru. The solution was added to an excess of methanol, collected by filtration and dried under vacuum. 9.69 g (58% yield) of polymer was recovered (Mw 42,000, Mn 31,000). DSC methods were used to measure the glass transition temperature (110° C.).

EXAMPLE 38

In a 100 ml glass vial containing nitrogen was dissolved 5.0 g of the polymer from Example 37 in THF (80 ml). The solution was transferred to a 300 ml stainless steel reactor. 2.25 g of 5 wt % palladium on alumina catalyst (purchased from Aldrich)was added to reactor. The reactor was then heated to 175° C. and pressurized with 800 psig hydrogen. Temperature and pressure were maintained for 9.5 hrs. The resulting polymer solution was centrifuged and the colorless solution was separated and the polymer was precipitated in excess methanol. NMR methods showed the resulting copolymer to be greater than 99% hydrogenated.

EXAMPLE 39
(50:50 Copolymer of t-BuNBEster/EtTDEster,)

To a 100 ml glass vial equipped with a magnetic stirring bar and containing nitrogen was added toluene (80 ml), t-butyl ester of norbornene carboxylic acid (3.9 g, 20 mmol), ethyl ester of tetracyclododecene carboxylic acid (4.64 g, 20 mmol) and 1-hexene (0.088 ml, 0.7 mmol). To this stirred solution was added, at ambient temperature, a solution of bis(tricyclohexylphosphine)benzylideneruthenium dichloride (68 mg, 0.084 mmol) in 5 ml of toluene. After 2 hours ethyl vinyl ether (30 $\mu$l) was added to the reaction to short stop further reactions and the mixture was stirred for 1.5 hours. The polymer solution was passed through a silica gel column to remove Ru residues and the polymer was then recovered as a clean white solid by precipitating into methanol. The polymer was found to have an Mw of 46,600 (Mn 33,700) and was fully characterized by IR, NMR and TGA methods.

EXAMPLE 40

To a stainless steel autoclave with an internal volume of 300 ml was added ethyl 2-methyl-4-pentenoate (99 g, 0.7 mole) and freshly cracked cyclopentadiene (46.4 g, 0.7 mole). The stirred mixture was heated to 200° C. and left overnight. The reactor was then cooled and the contents removed. The resulting functionalized norbornene (NB—$CH_2CH(CH_3)C(O)OC_2H_5$) was purified by vacuum distillation and found to have a boiling point of about 46–7° C. at 0.02 mm Hg. The material was analyzed by GC methods and found to have a purity of 98.4 to 99.3% (different fractions). The isolated yield of high purity product was around 33 g.

EXAMPLE 41
(40:60 Copolymer of t-BuNBEster (NB—$CH_2CH(CH_3)C(O)OC_2H_5$))

To a 100 ml glass vial equipped with a magnetic stirring bar and under a nitrogen atmosphere was added toluene (50 ml), t-butyl ester of norbornene carboxylic acid (2.7 g, 14 mmol) and the ester from Example 40 (NB—$CH_2CH(CH_3)C(O)OC_2H_5$) (4.4 g, 21 mmol). To this stirred solution was added, at ambient temperature, a solution of (toluene)Ni $(C_6F_5)_2$ in toluene (1 ml) and the resulting solution was heated to 50° C. and stirring was continued for 3 hours. The polymer was precipitated into methanol and filtered. The resulting solid was then redissolved in THF, filtered and precipitated again with methanol and filtered. The resulting white solid polymer was dried and found to weigh 2.66 g (Mw 70,000; Mn 39,800), the supernatant was evaporated to dryness to afford a further crop of white polymer which on drying weighed 1.52 g (Mw 60,650; Mn 31,000). The total yield of copolymer represented 59% conversion of the monomers. IR, NMR and TGA analysis of the copolymers confirmed their composition to be random addition copolymers of the two monomers.

EXAMPLE 42

(40:60 Copolymer of t-BuNBEster (NB—CH$_2$CH(CH$_3$)C(O)OC$_2$H$_5$)

To a 250 ml glass vial equipped with a magnetic stirring bar and under a nitrogen atmosphere was added dichloroethane (200 ml), t-butyl ester of norbornene carboxylic acid (7.76 g, 40 mmol) and the ester from Example 40 (NB—CH$_2$CH(CH$_3$)C(O)OC$_2$H$_5$) (12.5 g, 60 mmol) and 2,6-di-t-butylpyridine (28.8 mg, 0.26 mmol). To this stirred solution was added, at ambient temperature, a solution of the catalyst resulting from mixing allylpalladium chloride dimer (0.183 g, 0.5 mmol) with silver hexafluoroantimonate (equivalent amount) in dichloroethane (3 ml) and filtering to remove the silver chloride precipitate. The resulting solution was heated to 50° C. and stirring was continued for 16 hours. The polymer solution was treated with carbon monoxide (4 psi pressure) for 48 hours to precipitate the palladium residues, filtered through a 0.45μ filter, reduced in volume and precipitated with excess methanol to afford 7.9 g of the copolymer (39% conversion), Mw 11,600, Mn 7,000. The copolymer was fully characterized using IR, NMR and TGA methods.

EXAMPLE 43

Copolymerization of CO and Norbornene-5-t-butylester

A deoxygenated methanol solution of bipyridine (0.025 g, 0.16 mmol) was added to palladium (II) acetate (0.012 g, 0.053 mmol) dissolved in deoxygenated methanol. To this solution was added p-toluenesulfonic acid (0.045 g, 0.27 mmol) dissolved in deoxygenated methanol. The resulting brown solution was added to a methanol (deoxygenated) solution of benzoquinone (1.72 g, 1.59 mmol). This was added to a stainless steel reactor preheated to 50° C. To this reactor was added norbornene-5-t-butylester (5.14 g, 0.027 mol) in 100 ml of MeOH (deoxygenated with argon). The reactor was pressurized with carbon monoxide to 600 psig and warmed to 65° C. After 4.5 hours, the carbon monoxide was vented and the reactor was allowed to cool. The pink solution from the reactor was filtered to remove palladium residues and allowed to evaporate. The resulting mixture was dissolved in a minimum of THF and poured slowly into a 25:75 mixture of water:methanol to precipitate the polymer. This procedure was repeated twice. The resulting white polymer was filtered and dried at room temperature under vacuum. Yield=2.9 g.

EXAMPLE 43A

A deoxygenated, dried THF/methanol (35 ml/15 ml) solution of benzoquinone (0.43 g, 0.40 mmol), bipyridine (0.0062 g, 0.0040 mmol), and Pd(MeCN)$_2$(p-toluenesulfonate)$_2$ (0.0070 g, 0.0013 mmol) was added to a dry 500 ml stainless steel reactor warmed to 50° C. To the reactor was added norbornene-5-t-butylester (5.14 g, 0.027 mol) in 100 ml of THF (deoxygenated and dried). The reactor was pressurized with carbon monoxide to 600 psig and warmed to 65° C. After 12.5 hours, the reactor was heated to 90° C. for 1.5 hours. Then the carbon monoxide was vented and the reactor was allowed to cool. The purple solution from the reactor was filtered to remove palladium residues and allowed to evaporate. The resulting mixture was dissolved in a minimum of THF and poured slowly into a 25:75 mixture of water:methanol to precipitate the polymer. This procedure was repeated twice. The resulting white polymer was filtered and dried at room temperature under vacuum. Yield=2.9 g.

EXAMPLES 44 TO 50

Optical Density Measurements For Cyclic Olefin Based Homo and Copolymers at 193 nm Optical density is a critical characteristic of an effective photoresist because it determines the uniformity of the energy throughout the film thickness. A typical, lithographically useful, polymer backbone has an optical density of less than 0.2 absorbance units/micron prior to the addition of photoacid generators. (T. Neenan, E. Chandross, J. Kometani and O. Nalamasu, "Styrylmethylsulfonamides: Versatile Base-Solubilizing Components of Photoresist Resins" pg. 199 in Microelectronics Technology, Polymers for Advanced Imaging and Packaging, ACS Symposium Series 614, Eds: E. Reichmanis, C. Ober, S. MacDonald, T. Iwayanagai and T. Nishikubo, April, 1995). Polyhydroxystyrene, the primary component of typical 248 nm DUV photoresists, has an optical density of 2.8 absorbance units/micron at 193 nm and hence is unusable as a resist backbone at this wavelength.

Preparing Sample Solution

Samples of various polymers set forth in the foregoing examples (0.016±0.001 g of polymer) were weighed out and dissolved in 4 ml of chloroform. The solutions of the polymers were removed by pipette and thin films were cast on clean uniform quartz slides. The films were allowed to dry overnight. The resulting circular films on the quartz slides were further dried at 70° C. in an oven for 10 minutes under a nitrogen purge.

UV spectra of the films were obtained using a Perkin-Elmer Lambda 9 UV/VIS/IR spectrophotometer, at a scan speed of 120 nm/minute. The spectrum range was set at 300 nm to 180 nm. By measuring the absorbance of the films at 193 nm and normalizing them to the thickness of the films, the optical density of the films at 193 nm were measured. The results are set forth in the Table below:

| Example | Polymer | Absorbance at 193 nm (A) | Film Thickness (microns) | Normalized Absorbance at 193 nm (Å/micron) |
|---|---|---|---|---|
| 44 | 50/50 Copolymer of bicyclo[2.2.1]hept-5-ene-2-methyl acetate/t-butylester of norbornene (polymer of Example 21) | 1.0173 | 25.39 | 0.0400 |
| 45 | 50/50 Copolymer of bicyclo[2.2.1]hept-5-ene-2-methyl ethyl carbonate/t-butylester of norbornene (polymer of Example 22) | 0.1799 | 30.47 | 0.0059 |
| 46 | 50/50 Copolymer of bicyclo[2.2.1]hept-5-ene-2-methyl butyl carbonate/t-butylester of norbornene (polymer of Example 23) | 0.2808 | 33.01 | 0.0085 |
| 47 | Copolymer of maleicanhydride/t-butylester of norbornene (polymer of Example 24) | 1.1413 | 38.09 | 0.0299 |
| 48 | Terpolymer of bicyclo[2.2.1]hept-5-ene-2-methyl acetate/maleicanhydride/t-butylester of norbornene (polymer of Example 25) | 0.8433 | 17.78 | 0.04743 |
| 49 | 50/50 copolymer of t-butyl ester of norbornene/ethyl ester of tetracyclododecene (polymer of Example 29) | 0.4693 | 33.01 | 0.0142 |
| 50 | 50/50 copolymer of t-butyl ester of norbornene/ethyl ester of tetracyclododecene (polymer of Example 30) | 0.4146 | 35.55 | 0.0117 |

Preparation of Resist Solution, Exposure and Development:

The polymers obtained in the above examples were dissolved in propylene glycol monomethyl ether acetate (PGMEA) at 15 w/v % of solids, to which was added the onium salt set forth in the examples at 5 or 10 w/w % to the polymer.

The solutions were filtered through a 0.2µ Teflon® filter. A resist layer was formed from each solution by spin coating it onto a hexamethyldisilazane (HMDS) primed silicon wafer. The coated film was baked at 95° C. for 1 minute. The films were then exposed through a quartz mask to UV radiation from a Karl Suss MJB3 UV 250 instrument between the wave lengths of 230 to 250 nm. The exposed films were heated to 125° C. to 150° C. for 1 minute. The exposed and heated films were then developed in aqueous base to provide high resolution positive tone images without loss of film thickness in the unexposed regions.

The systems can be easily made negative working by development in a nonpolar solvent. These materials can be sensitized to the longer wave lengths (365 nm) by adding a small amount of sensitizers such as pyrene, perylene, or thioxanthones or to shorter wave lengths (193 nm), as these materials have been observed (as shown above) to have very low optical density at 193 nm.

EXAMPLE 51

The copolymer of bicyclo[2.2.1]hept-5-ene-2-methyl acetate/t-butylester of norbornene (the polymer of Example 21) number average molecular weight 21,000) was dissolved in propylene glycol monomethyl ether acetate (PGMEA) at 10 w/v % of solids. Triphenylsulfonium hexafluoroarsenate was added at a loading of 10 w/w % to the polymer. The resist film was filtered through a 0.2 µ Teflon® filter and the filtered solution was spin coated from the solution onto a hexamethyldisilazane primed silicon wafer at 500 rpm for 30 seconds followed by 2000 rpm for 25 seconds. This resulted in a 0.7 µ thick layer. The film was baked at 95° C. for 1 min over a hot plate and then exposed through a quartz mask to UV radiation (240 nm) at a dose of 50 mJ/cm². After post-baking at 125° C. for 1 minute, high resolution positive images were obtained by development in aqueous base for 60 seconds.

EXAMPLE 52

The copolymer of bicyclo[2.2.1]hept-5-ene-2-methyl acetate/t-butylester of norbornene (the polymer of Example 21) (number average molecular weight 21,000) was dissolved in propylene glycol monomethyl ether acetate (PGMEA) at 10 w/v % of solids. Diaryl iodonium hexafluoroantimonate (Sartomer 1012) was added at a loading of 10 w/w % to the polymer. The resist film was filtered through a 0.2µ Teflon® filter and the filtered solution was spin coated from the solution onto a hexamethyldisilazane primed silicon wafer at 500 rpm for 30 seconds followed by 2000 rpm for 25 seconds. This resulted in a 0.7 µthick layer. The film was baked at 95° C. for 1 min over a hot plate and then exposed through a quartz mask to UV radiation (240 nm) at a dose of 50 mJ/cm². After post-baking at 125° C. for 1 minute, high resolution positive images were obtained by development in aqueous base for 60 seconds.

EXAMPLE 53

Copolymer of bicyclo[2.2.1]hept-5-ene-2-methyl acetate/t-butylester of norbornene (the polymer of Example 21) (number average molecular weight 21,000) was dissolved in propylene glycol monomethyl ether acetate (PGMEA) at 10 w/v % of solids. Diaryl iodonium hexafluoroantimonate (Sartomer 1012) was added at a loading of 10 w/w % to the polymer. The resist film was filtered through a 0.2µ Teflon® filter and the filtered solution was spin coated from the solution onto a hexamethyldisilazane primed silicon wafer at 500 rpm for 30 seconds followed by 2000 rpm for 25 seconds. This resulted in a 0.7 µthick layer. The film was baked at 95° C. for 1 min over a hot plate and then exposed through a quartz mask to UV radiation (240 nm) at a dose of 100 mJ/cm². After post-baking at 125° C. for 1 minute, high resolution positive images were obtained by development in aqueous base for 60 seconds.

EXAMPLE 54

Copolymer of bicyclo[2.2.1]hept-5-ene-2-methyl acetate/t-butylester of norbornene (the polymer of Example 21) (number average molecular weight 21,000) was dissolved in propylene glycol monomethyl ether acetate (PGMEA) at 10 w/v % of solids. Triphenylsulfonium hexafluoroarsenate was added at a loading of 10 w/w % to the polymer. The resist film was filtered through a 0.2 µ Teflon® filter and the filtered solution was spin coated from the solution onto a hexamethyldisilazane primed silicon wafer at 500 rpm for 30 seconds followed by 2000 rpm for 25 seconds. This resulted in a 0.7 µthick layer. The film was baked at 95° C. for 1 minute over a hot plate and then exposed through a quartz mask to UV radiation (240 nm) at a dose of 10 mJ/cm². After post-baking at 125° C. for 1 minute, high resolution positive images were obtained by development in aqueous base for 60 seconds.

EXAMPLE 55

Copolymer of bicyclo[2.2.1]hept-5-ene-2-methyl acetate/t-butylester of norbornene (the polymer of Example 21) (number average molecular weight 21,000) was dissolved in propylene glycol monomethyl ether acetate (PGMEA) at 10 w/v % of solids. Triphenylsulfonium hexafluoroarsenate was added at a loading of 10 w/w % to the polymer. The resist film was filtered through a 0.2 µ Teflon® filter and the filtered solution was spin coated from the solution onto a hexamethyldisilazane primed silicon wafer at 500 rpm for 30 seconds followed by 2000 rpm for 25 seconds. This resulted in a 0.7 µthick layer. The film was baked at 95° C. for 1 minute over a hot plate and then exposed through a quartz mask to UV radiation (240 nm) at a dose of 30 mJ/cm². After post-baking at 125° C. for 1 minute, high resolution positive images were obtained by development in aqueous base for 60 seconds.

EXAMPLE 56

The copolymer of maleicanhydride/t-butylester of norbornene obtained via free radical polymerization (the polymer of Example 24) (number average molecular weight 4,000) was dissolved in propylene glycol monomethyl ether acetate (PGMEA) at 15 w/v % of solids. Triarylsulfonium hexafluoroantimonate (Sartomer CD 1010, 50% solution in propylene carbonate) was added at a loading of 5 w/w % to the polymer. The resist film was filtered through a 0.2µ Teflon® filter and the filtered solution was spin coated from the solution onto a hexamethyidisilazane primed silicon wafer at 500 rpm for 30 seconds followed by 2000 rpm for 25 seconds. This resulted in a 0.6 µthick layer. The film was baked at 95° C. for 1 minute over a hot plate and then exposed through a quartz mask to UV radiation (240 nm) at a dose of 30 mJ/cm². After post-baking at 125° C. for 1 minute, high resolution positive images were obtained by development in aqueous base for 60 seconds.

EXAMPLE 57

The copolymer of maleic anhydride/t-butylester of norbornene obtained via free radical polymerization (the polymer of Example 24) (number average molecular weight 4,000) was dissolved in propylene glycol monomethyl ether acetate (PGMEA) at 15 w/v % of solids. Triarylsulfonium hexafluoroantimonate (Sartomer CD 1010, 50% solution in propylene carbonate) was added at a loading of 5 w/w % to the polymer. The resist film was filtered through a 0.2 μ Teflon® filter and the filtered solution was spin coated from the solution onto a hexamethyldisilazane primed silicon wafer at 500 rpm for 30 seconds followed by 2000 rpm for 25 seconds. This resulted in a 0.6 μthick layer. The film was baked at 95° C. for 1 minute over a hot plate and then exposed through a quartz mask to UV radiation (240 nm) at a dose of 30 mJ/cm$^2$. After post-baking at 95° C. for 1 minute, high resolution positive images were obtained by development in aqueous base for 60 seconds.

EXAMPLE 58

The terpolymer of maleic anhydridetbicyclo[2.2.1]hept-5-ene-2-methyl acetate/t-butylester of norbornene obtained via free radical polymerization (the polymer of Example 25) (number average molecular weight 3000) was dissolved in propylene glycol monomethyl ether acetate (PGMEA) at 10 w/v % of solids. Diaryl iodonium hexafluoroantimonate (Sartomer 1012) was added at a loading of 10 w/w % to the polymer. The resist film was filtered through a 0.2μ Teflon® filter and the filtered solution was spin coated from the solution onto a hexamethyldisilazane primed silicon wafer at 500 rpm for 30 seconds followed by 2000 rpm for 25 seconds. This resulted in a 0.5 μthick layer. The film was baked at 95° C. for 1 minute over a hot plate and then exposed through a quartz mask to UV radiation (240 nm) at a dose of 50 mJ/cm$^2$. After post-baking at 125° C. for 1 minute, high resolution positive images were obtained by development in aqueous base for 60 seconds.

EXAMPLE 59

The copolymer of bicyclo[2.2.1]hept-5-ene-2-methyl ethylcarbonate/t-butylester of norbornene (the polymer of Example 22) (number average molecular weight 22,000) was dissolved in propylene glycol monomethyl ether acetate (PGMEA) at 15 w/v % of solids. Triarylsulfonium hexafluoroantimonate (Sartomer CD 1010, 50% solution in propylene carbonate) was added at a loading of 5 w/w % to the polymer. The resist film was filtered through a 0.2μ Teflon® filter and the filtered solution was spin coated from the solution onto a hexamethyldisilazane primed silicon wafer at 500 rpm for 30 seconds followed by 2000 rpm for 25 seconds. This resulted in a 1.1 μthick layer. The film was baked at 95° C. for 1 minute over a hot plate and then exposed through a quartz mask to UV radiation (240 nm) at a dose of 30 mJ/cm$^2$. After post-baking at 95° C. for 1 minute, high resolution positive images were obtained by development in aqueous base for 60 seconds.

EXAMPLE 60

The copolymer of bicyclo[2.2.1]hept-5-ene-2-methyl ethylcarbonate/t-butylester of norbornene (the polymer of Example 22) (number average molecular weight 22,000) was dissolved in propylene glycol monomethyl ether acetate (PGMEA) at 15 w/v % of solids. Triphenylsulfonium hexafluoroantimonate (Sartomer CD 1010, 50% solution in propylene carbonate) was added at a loading of 5 w/w % to the polymer. The resist film was filtered through a 0.2μ Teflon® filter and the filtered solution was spin coated from the solution onto a hexamethyldisilazane primed silicon wafer at 500 rpm for 30 seconds followed by 2000 rpm for 25 seconds. This resulted in a 1.1 μthick layer. The film was baked at 95° C. for 1 minute over a hot plate and then exposed through a quartz mask to UV radiation (240 nm) at a dose of 15 mJ/cm$^2$. After post-baking at 95° C. for 1 minute, high resolution positive images were obtained by development in aqueous base for 60 seconds.

EXAMPLE 61

The copolymer of bicyclo[2.2.1]hept-5-ene-2-methyl butylcarbonate/t-butylester of norbornene (the polymer of Example 23) (number average molecular weight 22,000) was dissolved in propylene glycol monomethyl ether acetate (PGMEA) at 15 w/v % of solids. Triarylsulfonium hexafluoroantimonate (Sartomer CD 1010, 50% solution in propylene carbonate) was added at a loading of 5 wlw % to the polymer. The resist film was filtered through a 0.2μ Teflon® filter and the filtered solution was spin coated from the solution onto a hexamethyldisilazane primed silicon wafer at 500 rpm for 30 seconds followed by 2000 rpm for 25 seconds. This resulted in a 1.0 μthick layer. The film was baked at 95° C. for 1 minute over a hot plate and then exposed through a quartz mask to UV radiation (240 nm) at a dose of 30 mJ/cm$^2$. After post-baking at 125° C. for 0.5 minute, high resolution positive images were obtained by development in aqueous base for 60 seconds.

EXAMPLE 62

The copolymer of bicyclo[2.2.1]hept-5-ene-2-methyl butylcarbonate/t-butylester of norbornene (the polymer of Example 23) (number average molecular weight 22,000) was dissolved in propylene glycol monomethyl ether acetate (PGMEA) at 15 w/v % of solids. Triarylsulfonium hexafluoroantimonate (Sartomer CD 1010, 50% solution in propylene carbonate) was added at a loading of 5 w/w % to the polymer. The resist film was filtered through a 0.2μ Teflon® filter and the filtered solution was spin coated from the solution onto a hexamethyldisilazane primed silicon wafer at 500 rpm for 30 seconds followed by 2000 rpm for 25 seconds. This resulted in a 1.0 μthick layer. The film was baked at 95° C. for 1 minute over a hot plate and then exposed through a quartz mask to UV radiation (240 nm) at a dose of 30 mJ/cm$^2$. After post-baking at 150° C. for 0.5 minute, high resolution positive images were obtained by development in aqueous base for 60 seconds.

EXAMPLE 63

A 35/65 mole % hydrogenated copolymer of ethylester of tetracyclodecene/t-butylester of norbornene (the polymer of Example 37) (number average molecular weight 23,000) obtained via ring opening metathesis polymerization was dissolved in propylene glycol monomethyl ether acetate (PGMEA) at 15 w/v % of solids. Triarylsulfonium hexafluoroantimonate (Sartomer CD 1010, 50% solution in propylene carbonate) was added at a loading of 5 w/w % to the polymer. The resist film was filtered through a 0.2μ Teflon® filter and the filtered solution was spin coated from the solution onto a hexamethyldisilazane primed silicon wafer at 500 rpm for 30 seconds followed by 2000 rpm for 25 seconds. This resulted in a 1.1 μthick layer. The film was baked at 95° C. for 1 minute over a hot plate and then exposed through a quartz mask to UV radiation (240 nm) at a dose of 30 MJ/cm$^2$. After post-baking at 125° C. for 1.0 minute, high resolution positive images were obtained by development in aqueous base for 30 seconds.

EXAMPLE 64

A 50/50 mole % nonhydrogenated copolymer of ethylester of tetracyclodecene/t-butylester of norbornene (the polymer of Example 39) (number average molecular weight 34,000) obtained via ring opening metathesis polymerization was dissolved in propylene glycol monomethyl ether acetate (PGMEA) at 15 w/v % of solids. Triarylsulfonium hexafluoroantimonate (Sartomer CD 1010, 50% solution in propylene carbonate) was added at a loading of 5 w/w % to the polymer. The resist film was filtered through a 0.2μ Teflon® filter and the filtered solution was spin coated from the solution onto a hexamethyldisilazane primed silicon wafer at 500 rpm for 30 seconds followed by 2000 rpm for 25 seconds. This resulted in a 1.25 μ thick layer. The film was baked at 95° C. for 1 minute over a hot plate and then exposed through a quartz mask to UV radiation (240 nm) at a dose of 50 mJ/cm². After post-baking at 150° C. for 30 seconds, high resolution positive images were obtained by development in aqueous base for 60 seconds.

We claim:

1. A photoresist composition comprising a photoacid initiator, an optional dissolution inhibitor, and an addition polymer comprising polycyclic repeating units excluding repeating units polymerized from maleimide(s) wherein at least a portion of said polycyclic repeating units contain pendant acid labile groups.

2. The composition of claim 1 wherein said polymer is polymerized from one or more acid labile group substituted polycyclic monomer(s) in optional combination with a monomer selected from the group consisting of a neutral group substituted polycyclic monomer, a carboxylic acid group substituted polycyclic monomer, an alkyl substituted polycyclic monomer, and mixtures thereof wherein said acid labile group monomer is represented by the structure:

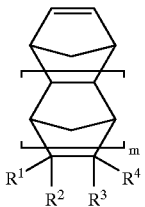

wherein $R^1$ to $R^4$ independently represent a substituent selected from the group consisting of hydrogen, linear and branched ($C_1$ to $C_{10}$) alkyl, and the group —$(CH_2)_n$—$C(O)OR^*$, 13 $(CH_2)_n$—$C(O)OR$, —$(CH_2)_n$—$OR$, —$(CH_2)_n$—$OC(O)R$, —$(CH_2)_n$—$OC(O)OR$, or —$(CH_2)_n$—$C(O)R$, —$(CH_2)_nC(R)_2CH(R)(C(O)OR^{})$, and —$(CH_2)_nC(R)_2CH(C(O)OR^{})_2$, subject to the proviso that at least one of $R^1$ to $R^4$ is selected from the acid labile group —$(CH_2)_nC(O)OR^*$, R represents hydrogen or linear and branched ($C_1$ to $C_{10}$) alkyl, m is an integer from 0 to 5 and n is an integer from 0 to 10, $R^*$ represents a moiety that is cleavable by a photoacid initiator, and $R^{**}$ independently represents R and $R^*$;

wherein said neutral group substituted monomer is represented by the structure:

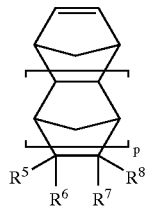

wherein $R^5$ to $R^8$ independently represent a neutral substituent selected from the group —$(CH_2)_n$—$C(O)OR''$, —$(CH_2)_n$—$OR''$, —$(CH_2)_n$—$OC(O)R''$, —$(CH_2)_n$—$OC(O)OR''$, —$(CH_2)_n$—$C(O)R''$, —$(CH_2)_n$—$C(R)_2CH(R)(C(O)OR'')$, and —$(CH_2)_nC(R)_2CH(C(O)OR'')_2$, wherein R represents hydrogen or linear and branched ($C_1$ to $C_{10}$) alkyl, R'' represents hydrogen or linear and branched ($C_1$ to $C_{10}$) alkyl, monocyclic and polycyclic ($C_4$ to $C_{20}$) cycloaliphatic moieties, cyclic esters, cyclic ketones, and cyclic ethers subject to the proviso that when R'' is hydrogen at least one of the remaining $R^5$ to $R^8$ groups contains a substituent where R'' is ($C_1$ to $C_{10}$) alkyl, p is an integer from 0 to 5, and n is an integer from 0 to 10; wherein said carboxylic group containing monomer is represented by the structure:

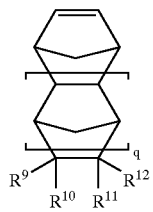

wherein $R^9$ to $R^{12}$ independently represent hydrogen, linear and branched ($C_1$ to $C_{10}$) alkyl, and a carboxylic substituent represented by the formula —$(CH_2)_nC(O)OH$, with the proviso that at least one of $R^9$ to $R^{12}$ is a carboxylic substituent, q is an integer from 0 to 5, and n is an integer from 0 to 10; and wherein said alkyl substituted monomer is represented by the structure:

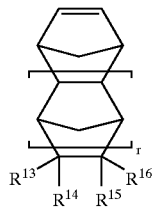

wherein $R^{13}$ to $R^{16}$ independently represent hydrogen or linear or branched ($C_1$ to $C_{10}$) alky, with the proviso that at least one of $R^{13}$ to $R^{16}$ is ($C_1$ to $C_{10}$) alkyl, and r is an integer from 0 to 5.

3. The composition of claim 2 wherein said monomers are polymerized by free radical polymerization.

4. The composition of claim 2 wherein said monomers are polymerized in the presence of a catalyst selected from the group consisting of a single component or multicomponent catalyst system each comprising a Group VIII metal ion source wherein said single component catalyst is represented by the formulae:

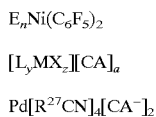

wherein in the formulae above, E represents a neutral 2 electron donor ligand, n is 1 or 2; L represents a ligand containing between 1, 2, or 3 π-bonds; M represents palladium or nickel; X represents a ligand containing 1 σ-bond and between 0 to 3 π-bonds; y is 0, 1, or 2 and z is 0 or 1, and wherein y and z cannot both be 0 at the same time, and when z is 0, a is 2, and when z is 1, a is 1; $R^{27}$ independently represents linear and branched ($C_1$ to $C_{10}$)alkyl; and CA is a counteranion selected from the group consisting of $BF_4^-$, $PF_6^-$, $AlF_3O_3SCF_3^-$, $SbF_6^-$, $SbF_5SO_3F^-$, $AsF_6^-$, perfluoroacetate ($CF_3CO_2^-$), perfluoropropionate ($C_2F_5CO_2^-$), perfluorobutyrate ($CF_3CF_2CF_2CO_2^-$), perchlorate ($ClO_4^-$·$H_2O$), p-toluene-sulfonate (p-$CH_3C_6H_4SO_3^-$) and tetraphenylborates represented by the formula:

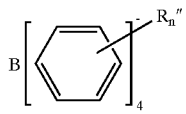

wherein R" independently represents hydrogen, fluorine and trifluoromethyl and n is 1 to 5; and wherein said multicomponent catalyst comprises:

(a) a Group VIII metal ion source in combination with one or both of;

(b) an organometal cocatalyst compound;

(c) a third component selected from the group consisting of Lewis acids, strong BrØnsted acids, halogenated compounds, electron donating compounds selected from aliphatic and cycloaliphatic diolefins, and mixtures thereof.

5. The composition of claim 4 wherein said Lewis acids are selected from the group consisting of $BF_3$·etherate, $TiCl_4$, $SbF_5$, $BCl_3$, $B(OCH_2CH_3)_3$, and tris(perfluorophenyl) boron, said strong BrØnsted acids are selected from the group consisting of $HSbF_6$, $HPF_6$, $CF_3CO_2H$, $FSO_3H.SbF_5$, $H_2C(SO_2CF_3)_2$, $CF_3SO_3H$ and paratoluenesulfonic acid; and said halogenated compounds are selected from the group consisting of hexachloroacetone, hexafluoroacetone, 3-butenoic acid-2,2,3,4,4-pentachlorobutyl ester, hexafluoroglutaric acid, hexafluoroisopropanol, and chloranil; wherein said electron donating compounds are selected from aliphatic and cycloaliphatic diolefins, phosphines and phosphites, and mixtures thereof.

6. The composition of claim 4 wherein the organometal compound is selected from the group consisting organoaluminum compounds, dialkyl zinc compounds, dialkyl magnesium, alkyllithium compounds, and mixtures thereof.

7. The composition of claim 4 wherein E is selected from the group consisting of toluene, benzene, mesitylene, THF, and dioxane.

8. The composition of claim 7 wherein the catalyst is selected from the group consisting of (toluene)bis(perfluorophenyl) nickel, (benzene)bis(perfluorophenyl) nickel, (mesitylene)bis(perfluorphenyl) nickel bis (tetrahrydrofuran)bis(perfluorophenyl) nickel, and bis (dioxane)bis(perfluorophenyl) nickel.

9. The composition of claim 1 wherein said polymer comprises repeating units selected from the structure:

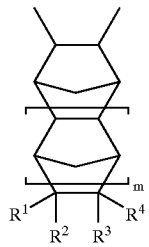

wherein $R^1$ to $R^4$ and m are as previously defined.

10. The composition of claim 9 wherein said polymer further comprises at least one repeating unit selected from the group represented as follows:

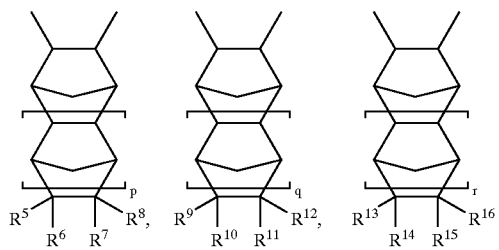

wherein $R^5$ to $R^{16}$, p, q, and r are as previously defined.

11. The composition of claim 7 wherein said monomers are polymerized in the presence of a catalyst selected from the group consisting of (toluene)bis(perfluorophenyl) nickel, (mesitylene)bis(perfluorophenyl) nickel, (benzene)bis (perfluorophenyl) nickel, bis(tetrahydrofuran)bis (perfluorophenyl) nickel, and bis(dioxane)bis (perfluorophenyl) nickel.

12. The composition of claim 1, 2, 9, or 10 wherein said polymer has a pendant perfluorophenyl group on at least one terminal end thereof.

13. The composition of claim 1, 2, 3, 9, 10, or 11 wherein said polymer contains 5 to 100 mole % of repeating units containing said acid labile groups.

14. The composition of claim 13 wherein said polymer contains 20 to 90 mole % of repeating units containing said acid labile groups.

15. The composition of claim 14 wherein said polymer contains 30 to 70 mole % of repeating units containing said acid labile groups.

16. A polymer produced by polymerizing a monomer composition comprising a polycyclic monomer and a solvent in the presence of a single component catalyst having the formula:

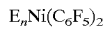

wherein E is a neutral 2 electron donor ligand and n is 1 or 2, and wherein said polycyclic monomer is selected from a monomer having the following formula:

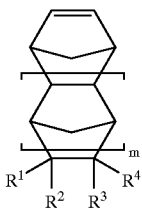

wherein $R^1$ to $R^4$ independently represent a substituent selected from the group consisting of hydrogen, linear and branched ($C_1$ to $C_{10}$) alkyl, and the group —$(CH_2)_n$—C(O)OR*, —$(CH_2)_n$—C(O)OR, —$(CH_2)_n$—OR, —$(CH_2)_n$—OC(O)R, —$(CH_2)_n$—OC(O)OR, or —$(CH_2)_n$—C(O)R, —$(CH_2)_nC(R)_2CH(R)(C(O)OR^{})$, and —$(CH_2)_nC(R)_2CH(C(O)OR^{})_2$, subjeact to the proviso that at least one of $R^1$ to $R^4$ is selected from the acid labile group —$(CH_2)_n$—C(O)OR*, R represents hydrogen or linear and branched ($C_1$ to $C_{10}$) alkyl, m is an integer from 0 to 5 and n is an integer from 0 to 10, R* represents a moiety that is cleavable by a photoacid initiator, and R** independently represents R and R*.

17. The polymer of claim 16 wherein said monomer composition further comprises a polycyclic monomer of the formula:

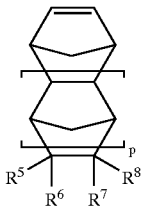

wherein $R^5$ to $R^8$ independently represent a neutral substituent selected from the group —$(CH_2)_n$—C(O)OR", —$(CH_2)_n$—OC(O)R", —$(CH_2)_n$—OC(O)R", —$(CH_2)_n$—C(O)OR", —$(CH_2)_nC(R)_2CH(R)(C(O)OR")$, and —$(CH_2)_nC(R)_2CH(C(O)OR")_2$, wherein R represents hydrogen or linear and branched ($C_1$ to $C_{10}$) alkyl, R" represents hydrogen or linear and branched ($C_1$ to $C_{10}$) alkyl, monocyclic and polycyclic ($C_4$ to $C_{20}$)cycloaliphatic moieties, cyclic esters, cyclic ketones, and cyclic ethers subject to the proviso that when R" is hydrogen at least one of the remaining $R^5$ to $R^8$ groups contains a substituent where R" is ($C^1$ to $C_{10}$) alkyl, p is an integer from 0 to 5, and n is an integer from 0 to 10.

18. The polymer of claim 17 wherein said monomer composition comprises monomers of the formulae:

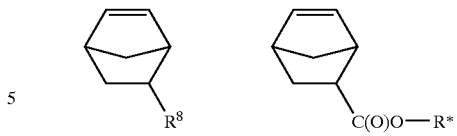

wherein R* is a moiety cleavable by a photoacid initiator and $R^8$ represents the group —$(CH_2)_n$—C(O)OR", —$(CH_2)_n$—OC(O)R", —$(CH_2)_n$—OC(O)OR", n is 0 to 5, and R" represents hydrogen linear ($C_1$ to $C_{10}$) alkyl.

19. The polymer of claim 16, 17 or 18 wherein said polymer has a pendant perfluorophenyl group at least one terminal end thereof.

20. The polymer of claim 16 wherein n is 1 and ligand E in said catalyst composition is selected from the group consisting of benzene, mesitylene, and toluene.

21. The polymer of claim 16 wherein n is 2 and ligand E in said catalyst composition is selected from the group consisting of THF, dioxane, and diethylether.

22. The composition of claim 2 or 9 wherein R* is selected from the group consisting of —$C(CH_3)_3$—$Si(CH_3)_3$ isobornyl, 2-methyl-2-adamantyl, tetrahydrofuranyl, tetrahydropyranyl, 3-oxocyclohexanyl, mevalonic lactonyl, dicyclopropylmethyl, and dimethylpropylmethyl.

23. The composition of claim 3 wherein said optional monomer further comprises carbon monoxide.

24. The composition of claim 1, 2, 9, 10, or 11 wherein said photoinitiator is selected from triflates, pyrogallol, onium salts, esters of hydroxyimides, α,α"-bis-sulfonyl-diazomethanes, sulfonate esters of nitro-substituted benzyl alcohols, and napthoquinone-4-diazides.

25. The composition of claim 22 wherein said photoinitiator is selected from triflates, pyrogallol, onium salts, esters of hydroxyimides, α,α'-bis-sulfonyl-diazomethanes, sulfonate esters of nitro-substituted benzyl alcohols, and napthoquinone-4-diazides.

26. The composition of claim 24 wherein said tiflate is triphenylsulfonium triflated and said pyrogallol is trimesylate of pyrogallol.

27. The composition of claim 24 wherein said onium salts include triarylsulfonium and diaryliodium hexafluoroantimonates, hexafluoroarsenates and trifluoromethane-sulfonates.

28. The composition of claim 24 wherein said dissolution inhibitor is t-butyl cholate.

* * * * *